(12) United States Patent  
Cao et al.

(10) Patent No.: US 7,864,909 B2
(45) Date of Patent: Jan. 4, 2011

(54) SIGNAL DELAY STRUCTURE IN HIGH SPEED BIT STREAM DEMULTIPLEXER

(75) Inventors: Jun Cao, Irvine, CA (US); Guangming Yin, Foothill Ranch, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/613,740

(22) Filed: Nov. 6, 2009

(65) Prior Publication Data

US 2010/0054384 A1 Mar. 4, 2010

Related U.S. Application Data

(63) Continuation of application No. 10/445,771, filed on May 27, 2003, now Pat. No. 7,616,725.

(60) Provisional application No. 60/403,457, filed on Aug. 12, 2002.

(51) Int. Cl.
*H04L 7/00* (2006.01)
(52) U.S. Cl. ............... 375/371; 375/257; 375/355; 375/375; 375/376
(58) Field of Classification Search ............... 375/371; 370/517
See application file for complete search history.

(56) References Cited

U.S. PATENT DOCUMENTS

| 6,868,504 | B1 * | 3/2005 | Lin .................. 713/500 |
| 6,960,948 | B2 * | 11/2005 | Kizer et al. ............ 327/147 |
| 7,206,956 | B2 * | 4/2007 | Johnson et al. ......... 713/401 |
| 2006/0129869 | A1 * | 6/2006 | Hendrickson et al. ..... 713/503 |

* cited by examiner

*Primary Examiner*—Shuwang Liu
*Assistant Examiner*—Dhaval Patel
(74) *Attorney, Agent, or Firm*—Garlick Harrison & Markison; Shayne X. Short; Bruce E. Garlick

(57) ABSTRACT

A signal delay structure and method of reducing skew between clock and data signals in a high-speed serial communications interface includes making a global adjustment to the clock signal in the time domain to compensate for a component of the skew that is common between the clock and all data signals. This can include skew caused by the variation in frequency of the input clock from a nominal value, misalignment between the phase of the clock and data generated at the source of the two signals. The global adjustment is made through a delay component that is common to all of the clock signal lines for which skew with data signals is to be compensated. A second level adjustment is made that compensates for the component of the skew that is common to the clock and a subset of the data signals.

20 Claims, 17 Drawing Sheets

Receiver Input and Source Centered Clock Performance

| Parameter | Symbol | Conditions | Min | Typ | Max | Units |
|---|---|---|---|---|---|---|
| Output Common Mode | Vcm | See Figure Below | 1575 | 1675 | 1775 | mV |
| Single Ended Output Impedance | $Z_{SE}$ | | 40 | 50 | 60 | Ω |
| Differential Input impedance | $Z_d$ | | 80 | 100 | 120 | Ω |
| Input Impedance Mismatch | $Z_M$ | | | | 10 | % |
| Q40, CML Input Differential Amplitude, p-p | Δ VQDO | See Figure Below | 400 | 500 | 600 | mV |
| Q40 Input Rise and Fall Time (20% to 80%) | $t_{RH}$, $t_{FH}$ | | | 25 | | ps |
| Differential output return loss* | S11 | Up to 7.5 GHz | 10 | | | dB |
| 4-by-1 mux input return loss >15 db at 10 GHz | | | | | | |

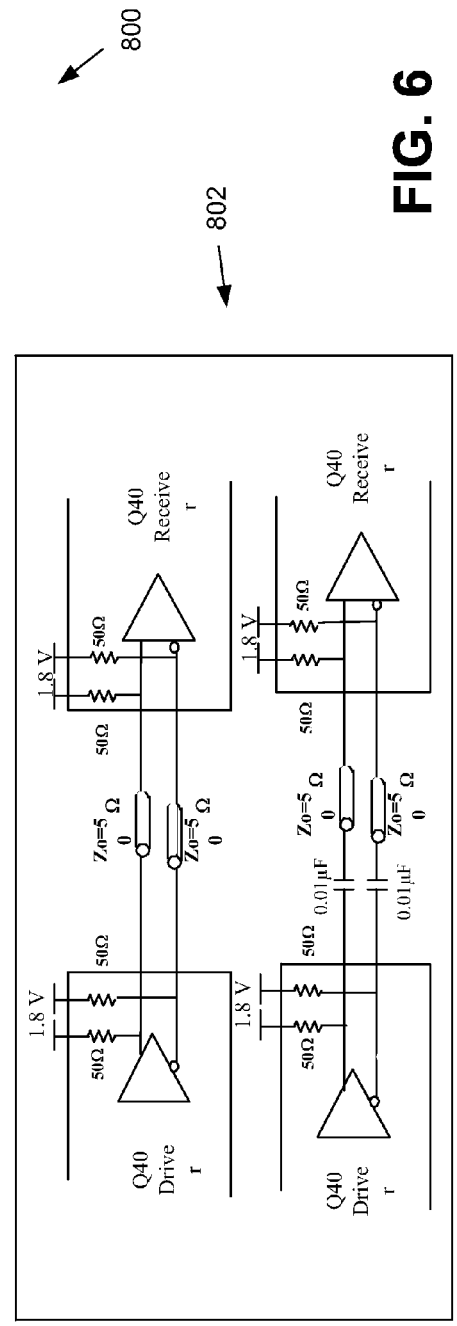

FIG. 6

SIGNAL DELAY STRUCTURE IN HIGH SPEED BIT STREAM DEMULTIPLEXER

CROSS REFERENCE TO RELATED PATENTS/PATENT APPLICATIONS

Continuation Priority Claim, 35 U.S.C. §120

The present U.S. Utility patent application claims priority pursuant to 35 U.S.C. §120, as a continuation, to the following U.S. Utility patent application which is hereby incorporated herein by reference in its entirety and made part of the present U.S. Utility patent application for all purposes:

1. U.S. Utility application Ser. No. 10/445,771, entitled "Signal delay structure in high speed bit stream demultiplexer," filed May 27, 2003, and scheduled to be issued as U.S. Pat. No. 7,616,725 on Nov. 10, 2009, which claims priority pursuant to 35 U.S.C. §119(e) to the following U.S. Provisional patent application which is hereby incorporated herein by reference in its entirety and made part of the present U.S. Utility patent application for all purposes:

a. U.S. Provisional Application Ser. No. 60/403,457, entitled "Signal delay structure in high speed bit stream demultiplexer with hybrid high-speed/low-speed output latch," filed Aug. 12, 2002, now expired.

BACKGROUND OF THE INVENTION

1. Technical Field of the Invention

The present invention relates generally to communication systems; and more particularly to high-speed serial bit stream communications.

2. Description of Related Art

The structure and operation of communication systems is generally well known. Communication systems support the transfer of information from one location to another location. Early examples of communication systems included the telegraph and the public switch telephone network (PSTN). When initially constructed, the PSTN was a circuit switched network that supported only analog voice communications. As the PSTN advanced in its structure and operation, it supported digital communications. The Internet is a more recently developed communication system that supports digital communications. As contrasted to the PSTN, the Internet is a packet switch network.

The Internet consists of a plurality of switch hubs and digital communication lines that interconnect the switch hubs. Many of the digital communication lines of the Internet are serviced via fiber optic cables (media). Fiber optic media supports high-speed communications and provides substantial bandwidth, as compared to copper media. At the switch hubs, switching equipment is used to switch data communications between digital communication lines. WANs, Internet service providers (ISPs), and various other networks access the Internet at these switch hubs. This structure is not unique to the Internet, however. Portions of the PSTN, wireless cellular network infrastructure, Wide Area Networks (WANs), and other communication systems also employ this same structure.

The switch hubs employ switches to route incoming traffic and outgoing traffic. A typical switch located at a switch hub includes a housing having a plurality of slots that are designed to receive Printed Circuit Boards (PCBs) upon which integrated circuits and various media connectors are mounted. The PCBs removably mount within the racks of the housing and typically communicate with one another via a back plane of the housing. Each PCB typically includes at least two media connectors that couple the PCB to a pair of optical cables and/or copper media. The optical and/or copper media serves to couple the PCB to other PCBs located in the same geographic area or to other PCBs located at another geographic area.

For example, a switch that services a building in a large city couples via fiber media to switches mounted in other buildings within the city and switches located in other cities and even in other countries. Typically, Application Specific Integrated Circuits (ASICs) are mounted upon the PCBs of the housing. These ASICs perform switching operations for the data that is received on the coupled media and transmitted on the coupled media. The coupled media typically terminates in a receptacle and transceiving circuitry coupled thereto performs signal conversion operations. In most installations, the media, e.g., optical media, operates in a simplex fashion. In such case, one optical media carries incoming data (RX data) to the PCB while another optical media carries outgoing data (TX data) from the PCB. Thus, the transceiving circuitry typically includes incoming circuitry and outgoing circuitry, each of which couples to a media connector on a first side and communicatively couples to the ASIC on a second side. The ASIC may also couple to a back plane interface that allows the ASIC to communicate with other ASICs located in the enclosure via a back plane connection. The ASIC is designed and implemented to provide desired switching operations. The operation of such enclosures and the PCBs mounted therein is generally known.

The conversion of information from the optical media or copper media to a signal that may be received by the ASIC and vice versa requires satisfaction of a number of requirements. First, the coupled physical media has particular RX signal requirements and TX signal requirements. These requirements must be met at the boundary of the connector to the physical media. Further, the ASIC has its own unique RX and TX signal requirements. These requirements must be met at the ASIC interface. Thus, the transceiving circuit that resides between the physical media and the ASIC must satisfy all of these requirements.

Various standardized interfaces have been employed to couple the transceiving circuit to the ASIC. These standardized interfaces include the XAUI interface, the Xenpak interface, the GBIC interface, the XGMII interface, and the SFI-5 interface, among others. The SFI-5 interface, for example, includes 16 data lines, each of which supports a serial bit stream having a nominal bit rate of 2.5 Giga bits-per-second (GBPS). Line interfaces also have their own operational characteristics. Particular high-speed line interfaces are the OC-768 interface and the SEL-768 interface. Each of these interfaces provides a high-speed serial interface operating at a nominal bit rate of 40 GBPS.

Particular difficulties arise in converting data between the 40×1 GBPS line interface and the 16×2.5 GBPS communication ASIC interface. In particular, operation on the 40 GBPS side requires the ability to switch data at a very high bit rate, e.g., exceeding the bit rate possible with a CMOS integrated circuit formed of Silicon. While other materials, e.g., Indium-Phosphate and Silicon-Germanium provide higher switching rates than do Silicon based devices, they are very expensive and difficult to manufacture. Further, the functional requirements of interfacing the 40×1 GBPS line interface and the 16×2.5 GBPS communication ASIC interface are substantial. Thus, even if a device were manufactured that could perform such interfacing operations, the effective yield in an Indium-Phosphate or Silicon-Germanium process would be very low.

One significant problem that can plague any high-speed clock data interface is timing skew. Timing skew is the difference between the times at which two signals arrive at a timing point in a circuit for which their arrival time is intended to be coincidental. For a high-speed data interface, it is critical for the proper transfer of data from a transmitting circuit to a receiving circuit that the clock, and particularly the edge of the clock used to latch the data into the receiving circuit, arrives coincidentally in time with arrival and availability of the data to be latched.

A number of factors can lead to the timing relationship between the clock and the data to be skewed when they reach the receiving circuit. First, the generation of the clock and data may be independent, so they may not necessarily start out coincidental in phase or even frequency. Additionally, the path over which the signals must propagate from the transmitting circuit to the receiving circuit may be quite different in length and load, leading to variations in propagation times. The clock is often fed to many circuits within the receiving circuit by way of large clock trees that can lead to some branches of the clock tree having different propagation delays than others. Significant skew can also occur between data signals, making a uniform adjustment for the skews that occur between clock and the different data lines very difficult.

The compensation for skew becomes especially critical at the clock frequencies and data rates employed in high speed serial bit stream communications circuits and systems. Because of the high frequencies (as high as 5 GHz clocks and 10 GHz data rates), the window of time available to perform the latching operation is very small. Jitter occurring on the data and clock lines further reduces the window, making it critical that any mismatches in propagation times and frequency be substantially eliminated.

Thus, there is a need in the art for a low cost and high speed interface that couples a high-speed line side interface to a communication ASIC, even in the presence of significant signal skew.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

These and other features, aspects and advantages of the present invention will be more fully understood when considered with respect to the following detailed description, appended claims and accompanying drawings wherein:

FIG. 6 is a table and a diagram that illustrate operating specifications for the RX interface between the RX data demultiplexer circuits of FIG. 3;

DETAILED DESCRIPTION OF THE INVENTION

Figure 1:
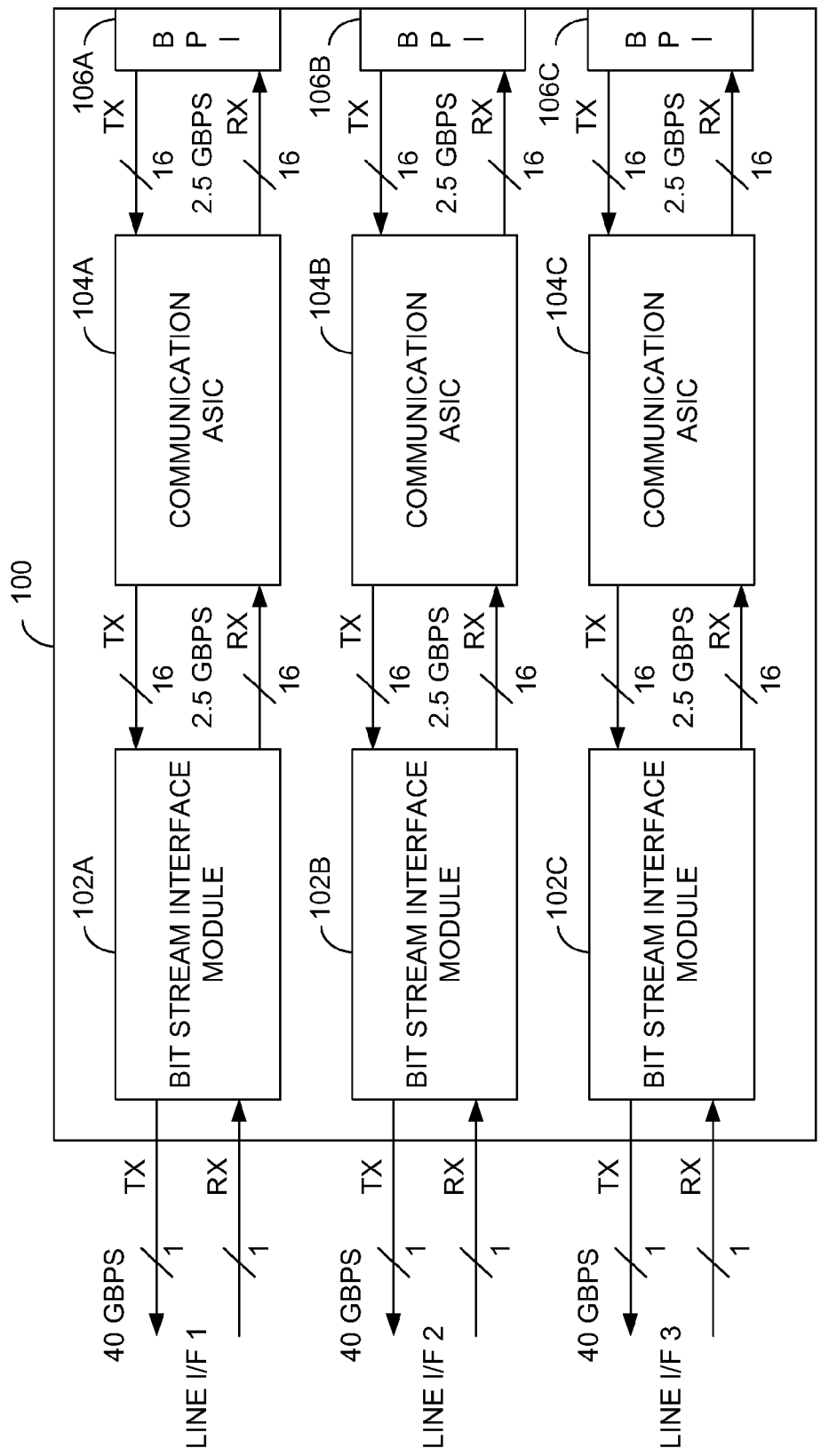
FIG. 1 is a block diagram illustrating a Printed Circuit Board (PCB) that has mounted thereon a plurality of Bit Stream Interface Module (BSIMs) constructed according to the present invention.

FIG. 1 is a block diagram illustrating a Printed Circuit Board (PCB) that has mounted thereon a plurality of Bit Stream Interface Module (BSIMs) constructed according to the present invention. As shown in FIG. 1, the PCB 100 includes BSIMs 102A, 102B and 102C. The PCB 100 also includes mounted thereupon communication Application Specific Integrated Circuits (ASIC) 104A, 104B, and 104C. The PCB 100 is mounted within a housing that services switching requirements within a particular location or geographic area. Each of the BSIMs 102A, 102B, and 102C couples to a high-speed media such as an optical fiber via a respective media interface and supports the OC-768 or the SEC-768 standard at such media interface. On the second side of the BSIMs 102A through 102C, the SFI-5 interface standard is supported. Communication ASIC 104A through 104C may communicate with other PCB components located in the housing via back plane interfaces (BPIs) 106A through 106C.

The BSIMs 102A through 102C may be removably mounted upon the PCB 100. In such case, if one of the BSIMs 102A through 102C fails it may be removed and replaced without disrupting operation of other devices on the PCB 100. When the BSIMs 102A-102C are removably mounted upon the PCB 100, they are received by a socket or connection coupled to the PCB 100. Further, in such embodiment, the BSIMs 102A-102C may be constructed on a separate PCB.

Figure 2A:
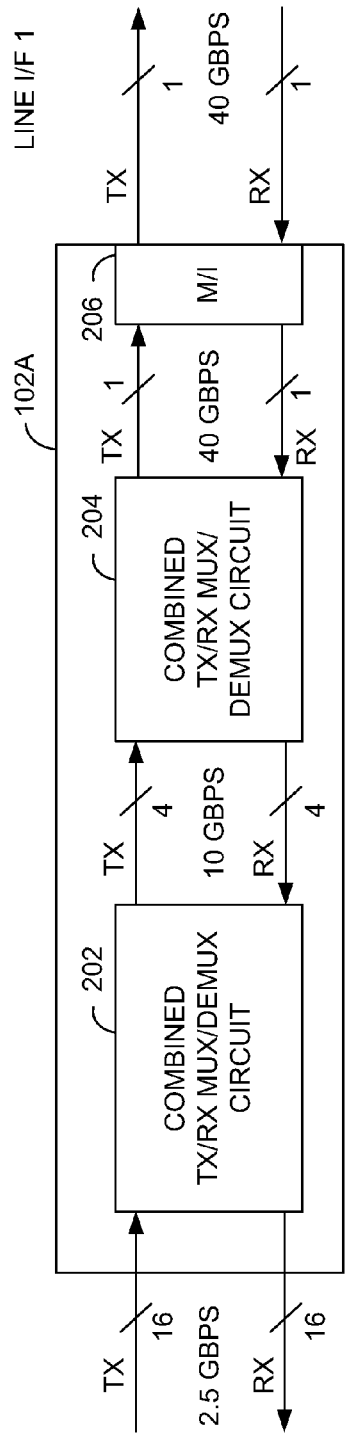
FIG. 2A is a block diagram illustrating one embodiment of a BSIM constructed according to the present invention.

FIG. 2A is a block diagram illustrating one embodiment of a BSIM 102A constructed according to the present invention. The BSIM 102A of FIG. 2A includes a first combined TX/RX multiplexer/demultiplexer circuit 202 and a second combined TX/RX multiplexer/demultiplexer circuit 204. On the line side of the BSIM 102A, the first combined TX/RX multiplexer/demultiplexer circuit 202 couples to a media, e.g., fiber optic cable or copper cable, via a media interface 206. The media interface 206 couples to the combined TX/RX multiplexer/demultiplexer circuit 204 via a 40 GPS nominal bit rate, one bit transmit and one bit receive interface. The TX and RX line medias themselves each support one bit 40 Giga bits-per-second (GBPS) nominal bit rate communications, such as is defined by the OC-768 and/or SEC 768 specifications of the OIF.

The combined TX/RX multiplexer/demultiplexer circuit 202 interfaces with a communication ASIC, e.g. 104A, via 16 TX bit lines and 16 RX bit lines, each operating at a nominal bit rate of 2.5 GBPS. Such interface supports a nominal total throughput of 40 GBPS (16*2.5 GBPS). The interface between the combined TX/RX multiplexer/demultiplexer circuit 202 and the combined TX/RX multiplexer/demultiplexer circuit 204 includes 4 TX bit lines and 4 RX bit lines, each operating at a nominal rate of 10 GBPS. This interface supports a nominal total throughput of 40 GBPS (4*10 GBPS). This interface may operate substantially or fully in accordance with an operating standard known as the Q40 operating standard. However, the teachings of the present invention are not limited to according to operation of the Q40 standard or is the description here intended to be a complete description of the Q40 standard itself.

Figure 2B:
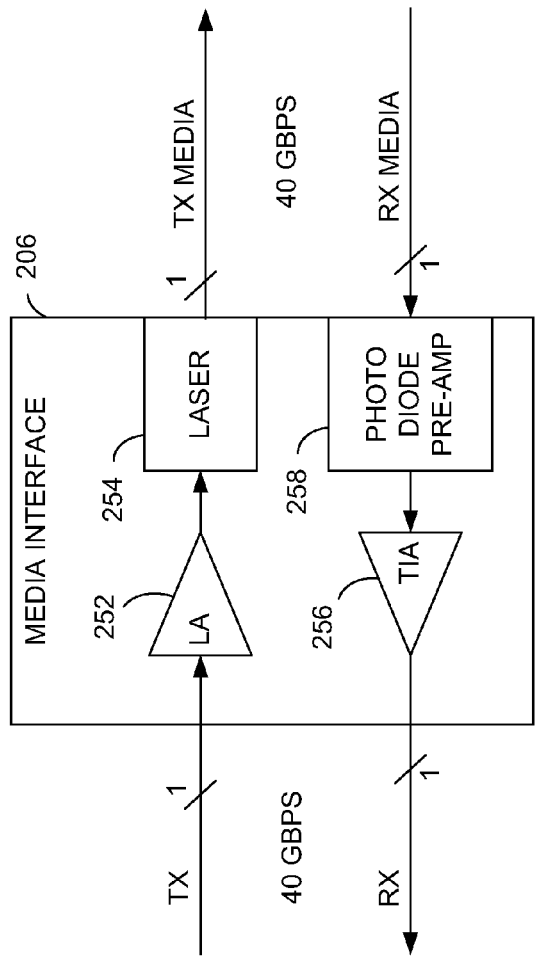
FIG. 2B is a block diagram illustrating an optical media interface that may be included with the BSIM of FIG. 2A.

FIG. 2B is a block diagram illustrating an optical media interface that may be included with the BSIM of FIG. 2A. As shown in FIG. 2B, media interface 206 couples to an optical media on a first side and couples to the combined TX/RX multiplexer/demultiplexer circuit 204 on a second side. In the transmit path, the media interface 206 receives a single bit stream at a nominal bit rate of 40 GBPS from the combined TX/RX multiplexer/demultiplexer circuit 204. The TX bit stream is amplified by limiting amplifier 252 to produce a bit stream output that is coupled to laser 254. The laser produces an optical signal that is coupled to TX optical media.

On the receive side, an RX optical media produces the RX bit stream at a nominal bit rate of 40 GBPS. The RX bit stream is received by a photo diode/pre-amplifier combination 258. The photo diode/pre-amplifier combination 258 produces an output that is received by a transimpedance amplifier 256. The output of the transimpedance amplifier 256 is a single bit stream at a nominal bit rate of 40 GBPS that is provided to the combined TX/RX multiplexer/demultiplexer circuit 204 of FIG. 2A.

Figure 3:
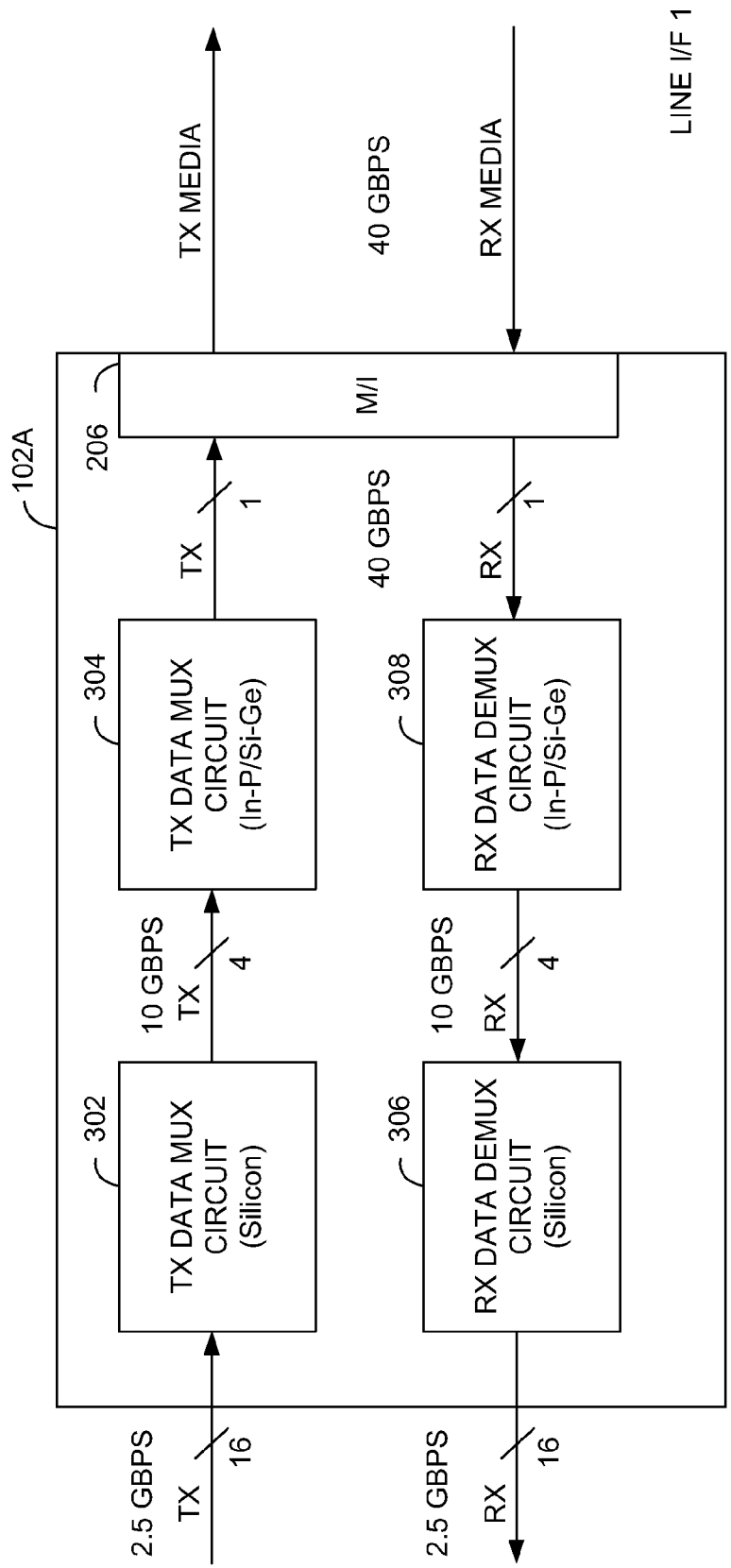
FIG. 3 is a block diagram illustrating another embodiment of a BSIM constructed according to the present invention.

FIG. 3 is a block diagram illustrating another embodiment of a BSIM constructed according to the present invention. The embodiment of FIG. 3 differs from the embodiment of FIG. 2A in that separate TX and RX circuit components are employed. While the media interface 206 of FIG. 3 is shown to be a single device such as shown in FIG. 2B, in other embodiments, the media interface 206 may be formed in separate circuits corresponding to the separate TX and RX paths shown in FIG. 2B.

In the TX path, TX data multiplexer circuit 302 receives a 16 bit wide by 2.5 GBPS nominal bit rate input from a coupled ASIC and produces a 4 bit wide×10 GBPS nominal bit rate TX output. In the embodiment described herein, the TX data multiplexer circuit 302 is constructed in a Silicon CMOS process, for example in a 0.13 micron CMOS process. The TX data multiplexer circuit 302 multiplexes the 16 bit wide by 2.5 GBPS nominal bit rate input to produce a 4 bit wide 10 GBPS nominal bit rate output, which is received by the TX data multiplexer circuit 304. The TX data multiplexer circuit 304 multiplexes the 4 bit wide×10 GBPS nominal bit rate output to produce a single bit wide output at a nominal bit rate of 40 GBPS.

The TX data multiplexer circuit 304 must switch at a frequency that is at least four times the rate at which the TX data multiplexer circuit 302 must switch. For this reason, the TX data multiplexer circuit 304 is constructed in an Indium-Phosphate process or in a Silicon-Germanium process. Each of these processes supports the higher switching rates required at the 40 GBPS output of the TX data multiplexer circuit 304. Thus in combination the TX data multiplexer circuit 302 constructed in a CMOS process and the TX data multiplexer circuit 304 constructed in an Indium-Phosphate or Silicon-Germanium process will provide a high performance relatively low cost solution to the interfacing of a 2.5 GBPS nominal bit rate 16 bit wide interface and a 40 GBPS 1 bit wide interface.

Likewise, in the RX path, the bit stream interface module 102A includes an RX data demultiplexer circuit 308 that receives a single bit stream at a nominal bit rate of 40 GBPS data. The RX data demultiplexer circuit 308 produces a 4 bit wide×10 GBPS nominal bit rate output. The RX data demultiplexer circuit 306 receives the 4 bit wide×10 GBPS nominal bit rate output and produces a 16 bit wide×2.5 GBPS nominal bit rate receive data stream.

As was the case with the TX data multiplexer circuit 302 and the TX data multiplexer circuit 304, the RX data demultiplexer circuit 306 and the RX data demultiplexer circuit 308 are formed in differing process types. In particular the RX data demultiplexer circuit 306 is constructed in a Silicon CMOS process. Further, the RX data demultiplexer circuit 308 is constructed in an Indium-Phosphate or Silicon-Germanium process so that the RX demultiplexer circuit 308 will support the higher switching speeds of the 1 bit wide×40 GBPS interface to the media interface 206.

Figure 4A:
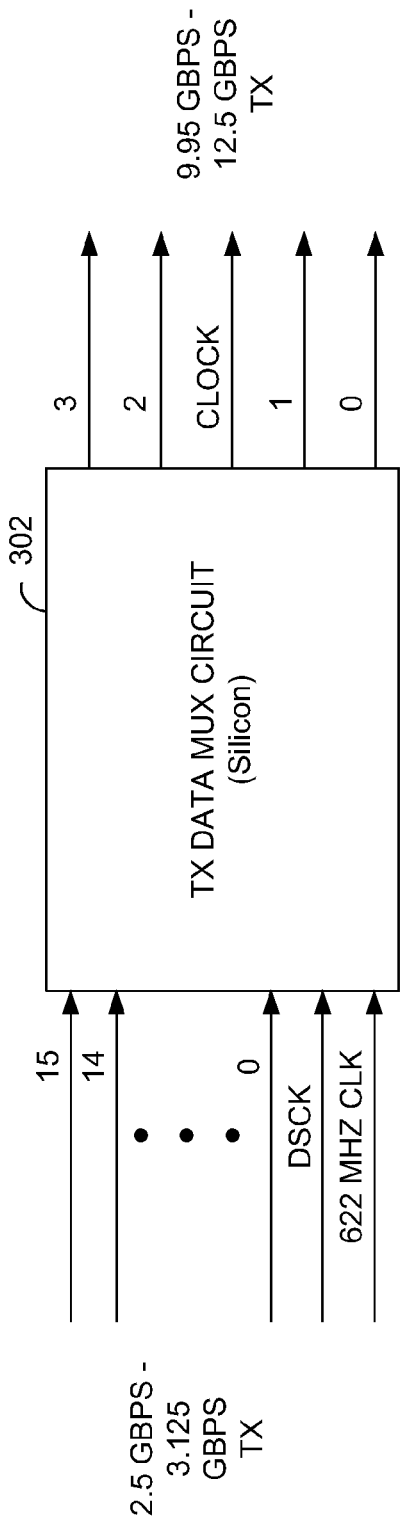
FIG. 4A is a block diagram illustrating a TX data multiplexer circuit constructed according to the present invention.

FIG. 4A is a block diagram illustrating a TX data multiplexer circuit constructed according to the present invention. As shown in FIG. 4A, the TX data multiplexer circuit 302 receives 16 bit steams of data at nominal bit rate of 2.5 GBPS on each bit line from the communication ASIC 104A. Each bit line of this 16 bit wide interface however can operate at bit rates of up to 3.125 GBPS. This interface also includes a DSCK clock and 622 MHz clock. The output of the TX data multiplexer circuit 302 includes 4 bit lines, each of which supports a nominal bit rate of 10 GBPS. However, the output of the TX data multiplexer circuit can produce data at bit rates of between 9.95 GBPS and 12.5 GBPS. The TX data multiplexer circuit 302 also produces a clock signal at one-half the nominal bit rate of the 4 bit stream paths. In such case, when the nominal bit rate of the data paths is 10 GBPS, the clock will be produced at 5 GHz.

Figure 4B:
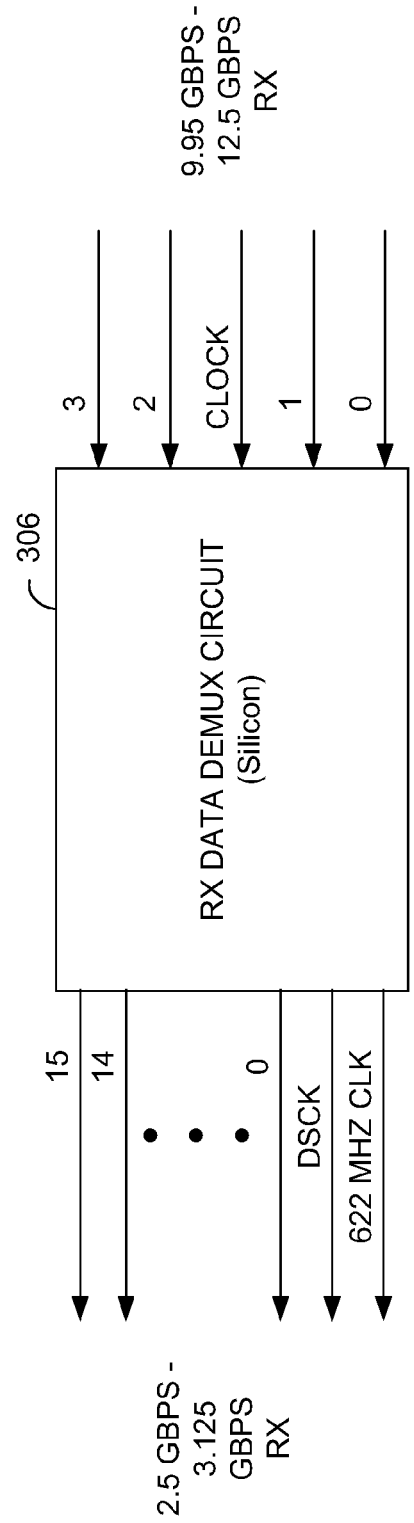
FIG. 4B is a block diagram illustrating an RX data demultiplexer circuit constructed according to the present invention.

FIG. 4B is a block diagram illustrating an RX data demultiplexer circuit 306 constructed according to the present invention. As shown in FIG. 4B, the RX data demultiplexer circuit 306 receives 4 bit streams at nominal bit rates of 10 GBPS each but may operate in the range of 9.95 GBPS to 12.5 GBPS. The RX data demultiplexer circuit 306 produces 16 bit stream outputs at a nominal bit rate of 2.25 GBPS. However, the RX data demultiplexer circuit 306 may produce the 16 bit streams output at a bit rate of between 2.5 GBPS and 3.125 GBPS.

Figure 5:
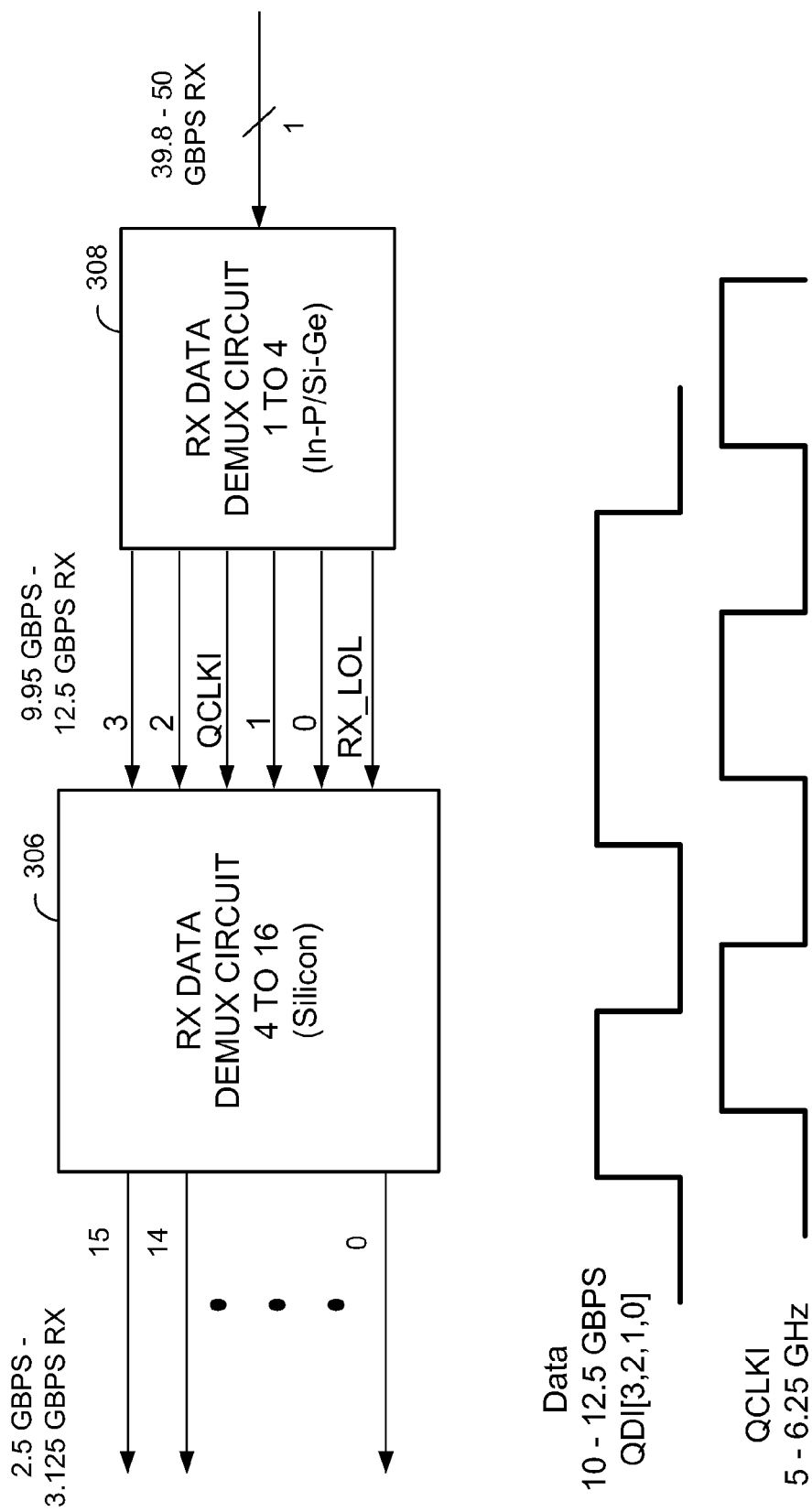
FIG. 5 is a block diagram illustrating the RX data demultiplexer circuits of FIG. 3 and the interfaces serviced thereby.

FIG. 5 is a block diagram illustrating the RX data demultiplexer circuits 306 and 308 of FIG. 3 and the interfaces serviced thereby. As is shown in FIG. 5, the RX data demultiplexer circuit 308 receives a single bit stream at a nominal bit rate of 40 GBPS. However, the single bit stream input may operate at bit rates from between 39.8 GBPS and 50 GBPS. The RX data demultiplexer circuit performs a 1 to 4 demultiplexing operation on the received single bit stream to produce 4 output bit streams at a nominal bit rate of 10 GBPS. However, the RX data demultiplexer circuit 308 may also produce output at bit rates from 9.95 GBPS to 12.5 GBPS.

The RX data demultiplexer circuit 306 receives the 4 bit streams having nominal bit rates of 10 GBPS each and a QCLKI signal and a RX_LOL signal from the RX data demultiplexer circuit 308. Based upon these input signals, the RX data demultiplexer circuit 306 produces the 16 bit stream outputs at nominal bit rates of 2.5 GBPS. Also shown in FIG. 5, the QCLKI signal operates at one-half the frequency of the bit rate of the data stream received from the RX data demultiplexer circuit 308. Thus, in such case, for the nominal bit rate of 10 GBPS, the QCLKI signal will be provided at 5 GHz.

Because the clock and data are both generated externally to the RX data demultiplexer circuit 306, and because the data and clock signals must travel over PC board traces that likely will have varying lengths and therefore varying parasitic loads, there is a very strong potential for skewing to occur between the clock QCLKI and data the 4 bit streams generated by InP circuit 308. Given the high speed at which these inputs operate, there is very little room for delay caused by mismatches between the clock and data signals. Without the signal delay method and structure of the present invention, there could be no guarantee that the clock data relationship will comport with the following specifications established for that relationship. Further, because each of the data paths is unique across the PCB, it is highly likely that, even though the RX data demultiplexer circuit 308 produces data that is aligned upon transmission, the data will not be aligned upon receipt by the RX data demultiplexer circuit 306.

FIG. 6 includes a table and a diagram that illustrate operating specifications for the RX interface between the RX data demultiplexer circuits 308 and 306 of FIG. 3. As shown in FIG. 6, the receiver input parameters are shown at 800 and an equivalent circuit thereupon is shown at 802.

Figure 7:
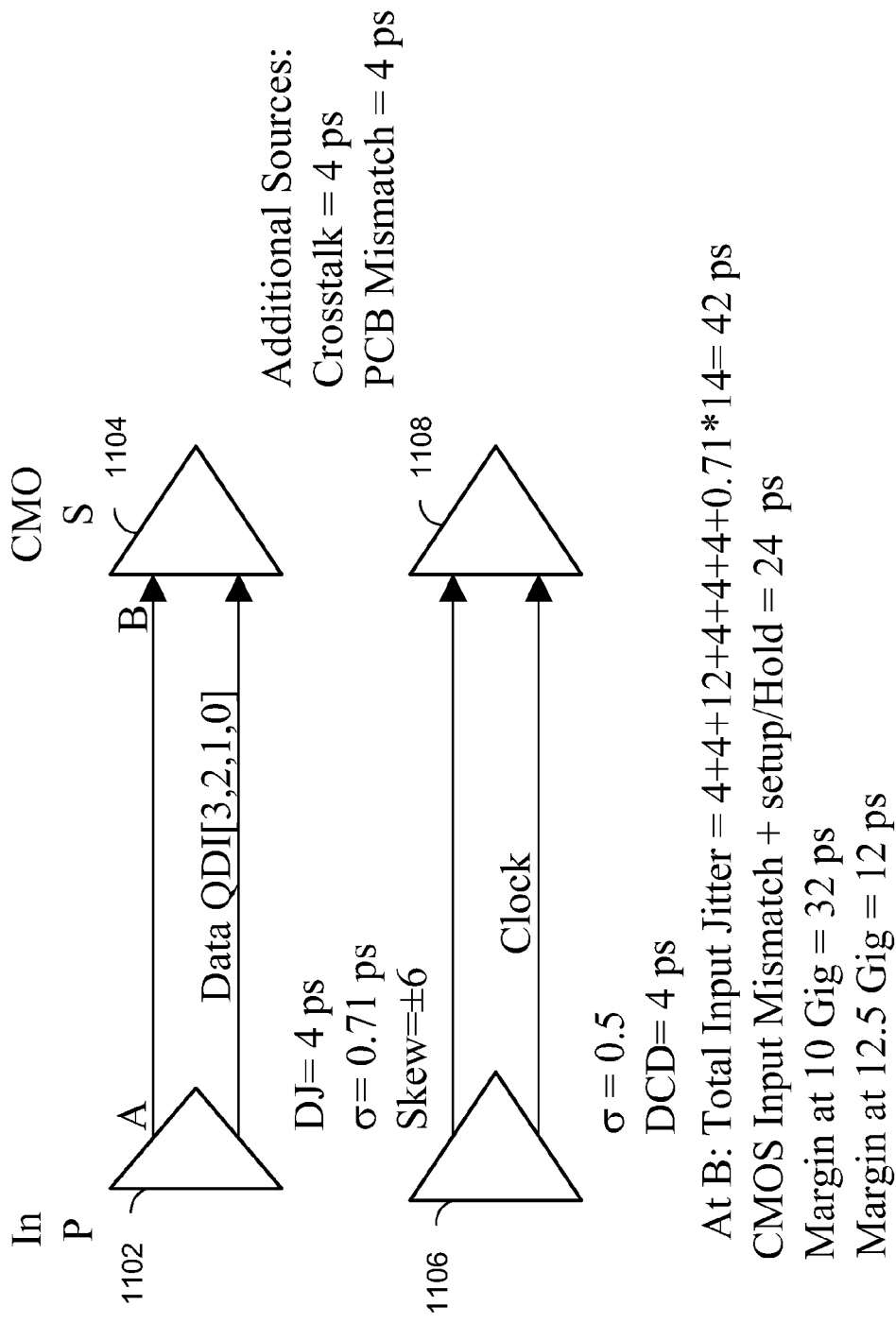
FIG. 7 is a block diagram illustrating the jitter allocation for the RX link between RX data multiplexer circuits of FIG. 3.

FIG. 7 is a block diagram illustrating the jitter allocation for the RX link between RX data demultiplexer circuits 308 and 306 of FIG. 3. One of four data differential data line drivers 1102 of the RX data demultiplexer circuit 308 and a differential clock driver 1106 of the RX data demultiplexer circuit 308 on the 4 bit stream 10 GBPS side are shown. FIG. 7 also shows one of four data input buffers 1104 of the RX data demultiplexer circuit 306 and a clock input buffer 1108 of the RX data demultiplexer circuit 306. As is indicated, deterministic jitter for the data interface is specified as a maximum of 8 picoseconds. Further, the skew or non-deterministic jitter in the data lines is limited to ±8 picoseconds. The additional information provided in FIG. 7 shows how these jitters may be summed to result in maximum jitters.

Figure 8:
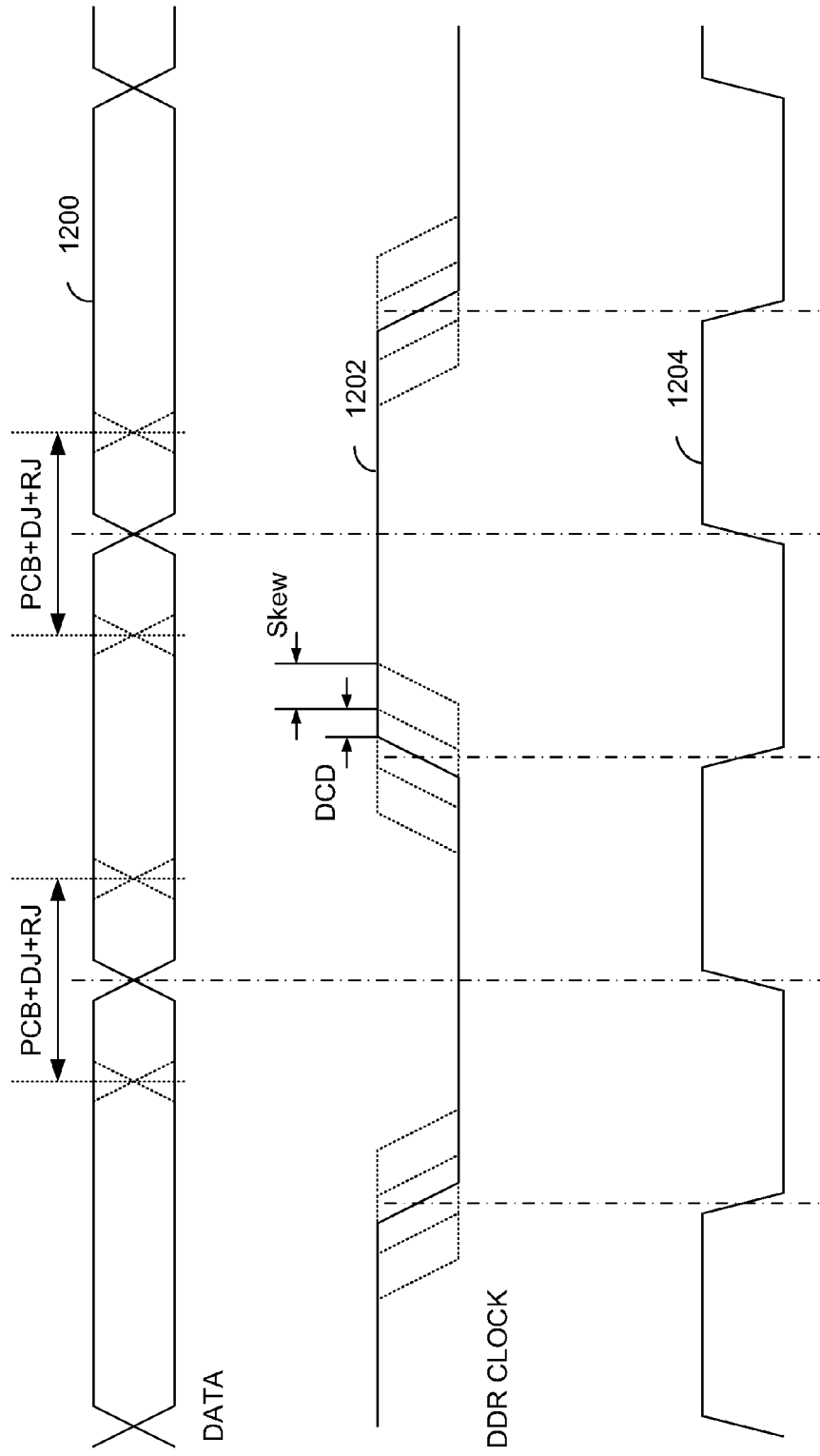
FIG. 8 includes timing diagrams illustrating the set up and hold operations on the 4 bit wide×10 GBPS links between the RX data demultiplexer circuits of FIG. 3.

FIG. 8 is a timing diagram illustrating the set up and hold operations on the 4 bit×10 GBPS links between the TX data demultiplexer integrated circuits 306 and 308 of FIG. 3. In particular, the diagram illustrates the jitter relationships and definitions of the data 1200, the DDR clock 1202 and a full rate clock 1204.

Figure 9:
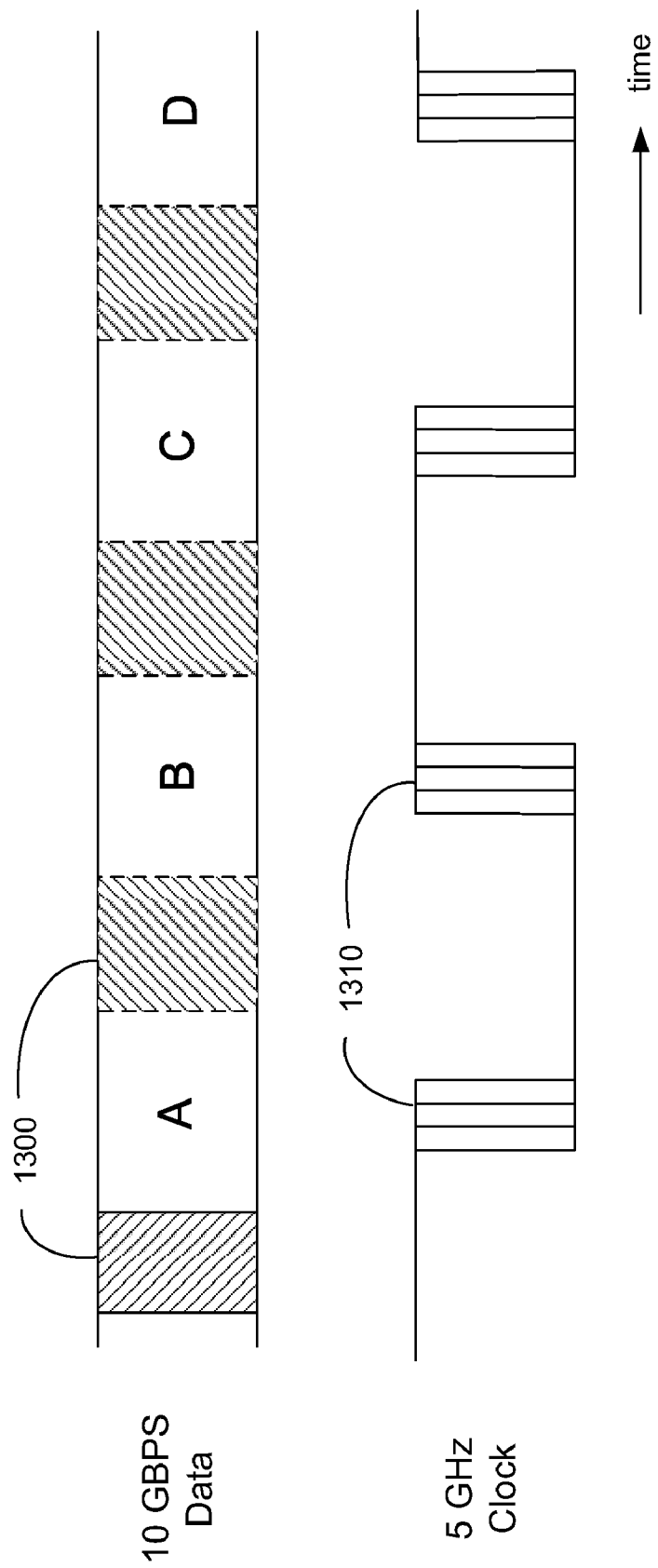
FIG. 9 provides an illustration of the jitter that can be experienced by the four 10 GPBS data inputs in relation to the jitter experienced by the 5 GHz clock input between the RX data demultiplexer circuits of FIG. 3.

FIG. 9 provides an illustration of the jitter that can be experienced by the four 10 GPBS data inputs in relation to the jitter experienced by the 5 GHz clock input to the RX data demultiplexer circuit 306. Because of this jitter, there is little or no room for error regarding the skewing that can be permitted to occur between the clock arriving at the various demultiplexers of the RX data demultiplexer circuit 306 and the data that is to be demultiplexed by the RX data demultiplexer circuit 306. Given the amount of jitter 1300 that can occur on the data, in combination with the jitter 1310 that can occur on the clock, and the frequency at which the clock and data are switching, there is very little guaranteed open window during which the data can be latched.

Figure 10:
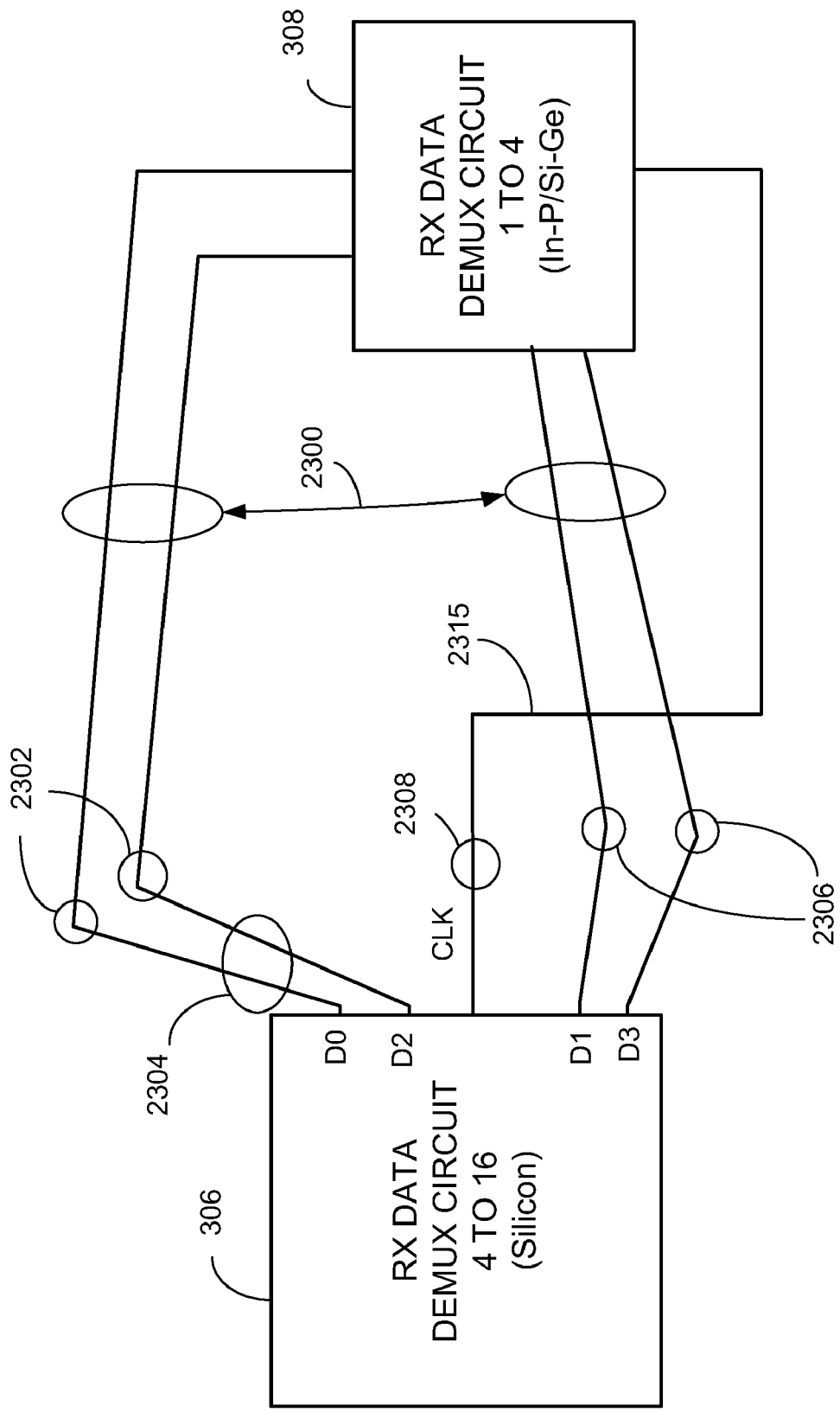
FIG. 10 illustrates how significant skew can accumulate between signals on the various data lines and the clock lines forming the interface between the RX data demultiplexer circuits of FIG. 3.

FIG. 10 illustrates how significant skew can accumulate between signals on the various data lines and the clock lines forming the interface between the RX data demultiplexer circuits 306 and 308 of FIG. 3. The skew can result from varying trace lengths of the individual data lines 2304 as well as variations between the lengths of various pairs of individual traces 2300 with respect to one another. These differences can result from package mounting variations between the various pads due to wire bond locations 2302, and 2306, and 2308 as well as wire bond lengths, 2304, etc. Other sources of skewing result from (1) the generation of the clock and data by the InP circuit 308 and the mismatches in phase and frequency that originate with the generation of those signals; and (2) the parasitic loads from the traces running on the PC boards (and variations thereof).

Figure 11:
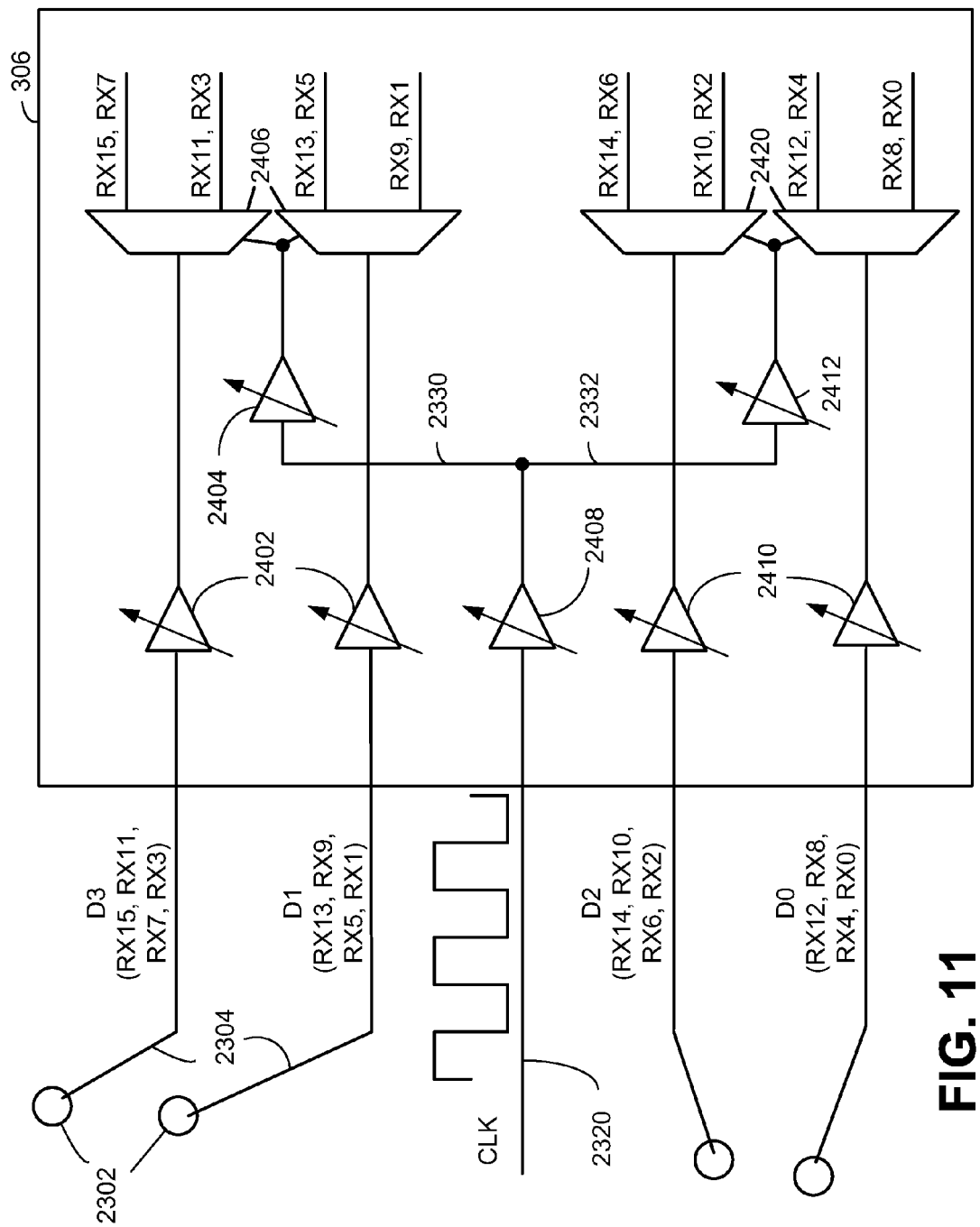
FIG. 11 illustrates an embodiment of the signal delay structure and method of the invention.

FIG. 11 is a block diagram illustrating a signal delay compensation structure constructed according to the present invention. This signal delay compensation structure may be formed at the input of the RX data demultiplexer circuit 306, for example. The embodiment represents a distributed programmable delay tree. The RX data demultiplexer circuit 306 receives data from the InP demultiplexer circuit 308 at data inputs 2302. The RX data demultiplexer circuit 306 also receives the clock 2320 that is used to latch the data from the InP RX demultiplexer integrated circuit 308. Demultiplexers, indicated as demultiplexer groups 2406 and 2412 demultiplex the data on the clock positive and negative going edges. As is illustrated, the demultiplexer integrated circuit 306 receives data on four data lines, D3, D2, D1, and D0. Data line D3 carries RX data bits RX15, RX11, RX7, and RX3. Data line D1 carries RX data bits RX13, RX9, RX5, and RX1. Data line D2 carries RX data bits RX14, RX10, RX6, and RX2. Data line D0 carries RX data bits RX12, RX8, RX4, and RX0. The demultiplexers 2406 demultiplex the data as illustrated. Of course, a second level of demultiplexers (not shown) is required to produce 16 data lines, each carrying a single RX data bit. The first two data lines are indicated via numeral 2304 while the second two data lines are indicated via numeral 2332.

A first level delay element 2408 is provided to make overall adjustments between the clock and the data, with a certain delay range that is, for the example of the RX data demultiplexer circuit 306 coupled to the InP demultiplexer circuit 308, designed to be at plus or minus 10 ps. This delay element 2408 is designed to compensate for a component of the skew that is relatively common to the clock and all of the data inputs, and is the predominate component of the skew. The delay element 2408 is intended to correct a combination of the skew created internally to the InP demultiplexer integrated circuit 308 and the mismatch of the clock and data line paths from the InP demultiplexer integrated circuit 308 to the RX data demultiplexer circuit 306 as illustrated by the clock line CLK 2315 of FIG. 10. As is described further below delay elements 2408 also include an adjustment to compensate for a range in operating frequency that is permissible for the 5 GHz clock 2320 (i.e. 5 to 6.25 GHz).

Second-level clock delay elements 2404 and 2412 couple to the delay element 2408 to receive the output from the first level clock delay element 2408. The outputs of the second-level clock delay elements 2404 and 2412 serve as clocks to demultiplexers of demultiplexer groups 2406 and 2420, respectively. The delays provided by the second-level clock delay elements 2404 and 2412 are separately controllable to provide selected delay levels to the clock signal prior to being applied to their serviced demultiplexer groups 2406 and 2420. These second-level delay elements 2412 provide additional tuning of the delay to compensate for a secondary component of the clock/data skew that is specific to the data line pairs 2330 and 2332, respectively. These second-level delay elements 2404 and 2412 are designed to provide an additional delay range of plus/minus 10 picoseconds, particularly for the example of the RX data demultiplexer circuit 306 coupled to the InP demultiplexer circuit 308. Thus, a total clock delay of plus or minus 20 picoseconds is distributed over the two levels of delay elements, the first half being applied to the clock globally, and the other half being applied to the clock more locally.

A particular advantage of the delay structure of FIG. 11 relates to the central location of the clock with respect to the data. This symmetric clock arrangement ensures that the clock is not skewed once it enters the RX demultiplexer circuit 306 with respect to the demultiplexers of groups 2406 and 2420. Put another way, the delay adjustment provided by the first level clock delay element 2408 will be virtually identical, thus rendering the course clock adjustment consistent between the two pairs of demultiplexers 2406 and 2420.

Delay elements 2402, 2410 are provided for each of the data inputs as well. These delay elements provide the additional degree of freedom necessary to compensate the clock/data skew for each individual data line. The amount of delay range provided by these delay elements is sufficient to overcome the difference in clock/data skew between the various data lines as caused by PC board design and package mounting. This difference is illustrated by the wire bonds 2302 and bond wires 2304 shown in FIGS. 10 and 11. Each of this third group of delay elements 2402 and 2410 provides plus or minus 2 picoseconds for the example of the RX data demultiplexer circuit 306 coupled to the InP demultiplexer circuit 308, which in this example is sufficient to cover the minor difference in data arrival times due to differing lengths of bond wires and PC boards.

Figure 12A:
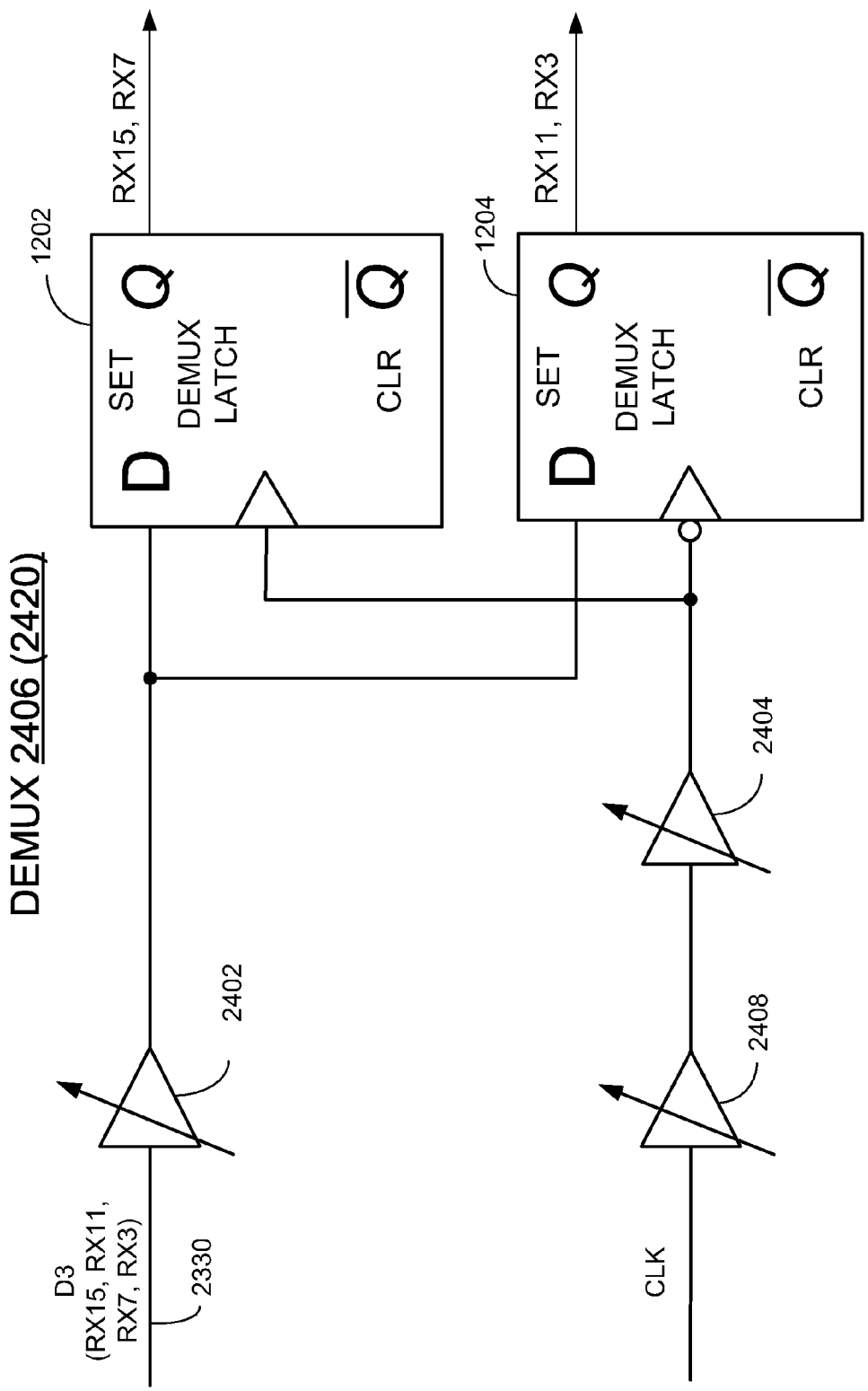
FIG. 12A is a block diagram illustrating a structure employed to implement demultiplexers of the CMOS RX data demultiplexer circuit according to the present invention.

FIG. 12A is a block diagram illustrating a structure employed to implement demultiplexers of the CMOS RX data demultiplexer circuit according to the present invention. The structure of FIG. 12A performs the demultiplexing function of demultiplexer pairs 2406, 2420. FIG. 12A also illustrates the relationship of the data and clock inputs to the delay elements 2402, 2404, and 2408.

Demultiplexer latches 1202 and 1204 are coupled to the D3 data input and a common clock input from the output of second-level delay element 2404. Demultiplexer latch 1202 is triggered by the positive edge of the clock and demultiplexer latch 1204 is triggered on the negative edge of the clock. On the positive edge of a first clock cycle, bit RX15 is latched into demultiplexer latch 1202 and provided as an output. On the negative edge of the first clock cycle, RX11 is latched into demultiplexer latch 1204 and provided as an output. During a next clock cycle bit RX7 is latched into demultiplexer latch 1202 on a positive edge and provided as an output while RX3 is latched into demultiplexer latch 1204 on a negative edge and provided as an output.

Figure 12B:
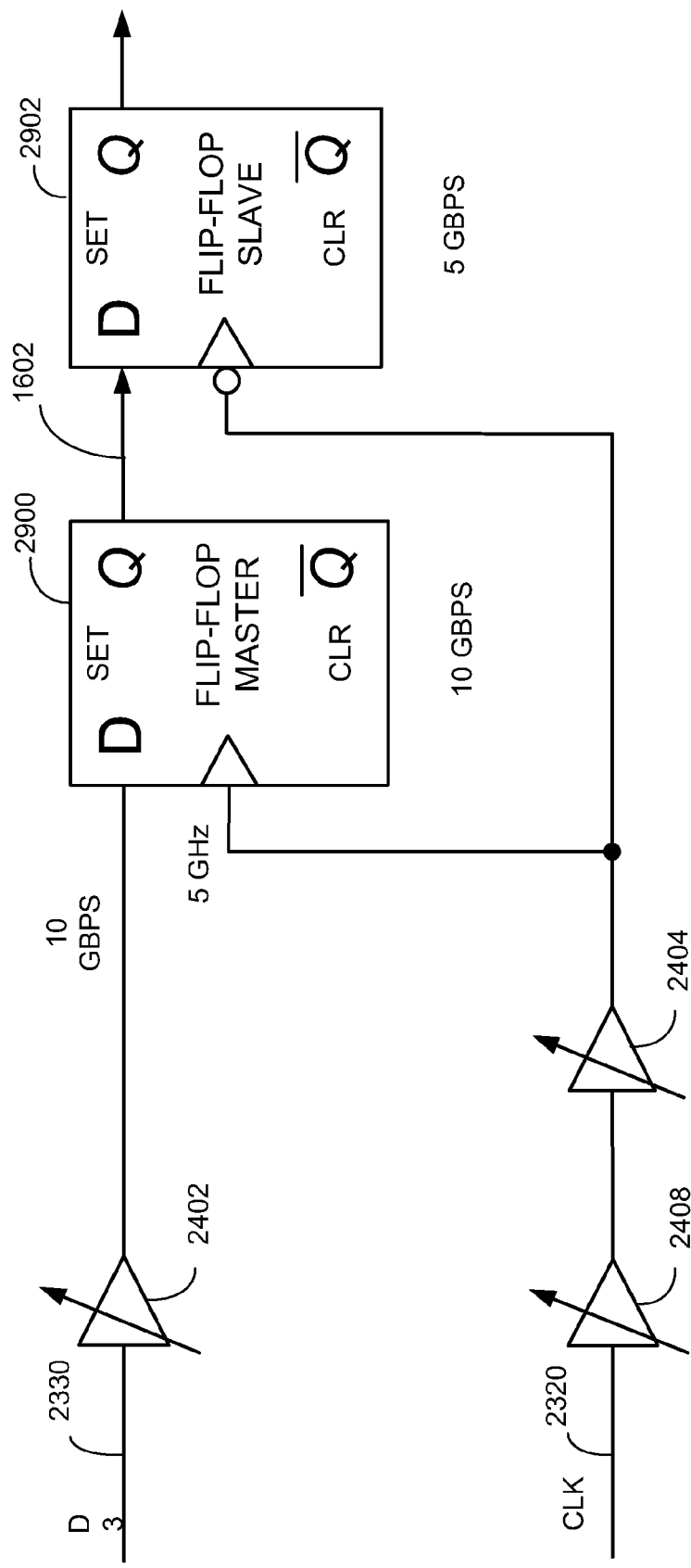
FIG. 12B is a block diagram illustrating a master/slave flip-flop arrangement used for the demultiplexer latches of FIG. 12A.

FIG. 12B is a block diagram illustrating a master/slave flip-flop arrangement used for the demultiplexer latches of FIG. 12A. This particular master/slave flip-flop arrangement is used for implementing the demultiplexer latches 1202, 1204 of demultiplexers 2404, 2406. In typical applications, the D flip-flops that implement demultiplexer latches 1202, 1204 are clocked at the same rate as their incoming data. They are positive edge triggered, so the flip-flop master 2900 and flip-flop slave 2902 are also clocked at the same frequency as the incoming data D3 2330. In that case both the flip-flop master 2900 and flip-flop slave 2902 must operate at the data rate, which in the case of the RX data demultiplexer circuit 306, is 10 GBPS. As previously discussed, flip flops (and the latches contained therein) capable of operating at 10 GBPS in a conventional 0.13µ CMOS process each requires two very large inductors to compensate for the parasitic capacitance that is problematic at such high frequencies of operation. Thus, in the example of the RX data demultiplexer circuit 306, four channels each having four demultiplexers, each having two D flip-flops, each having two latches translates to thirty-two very large inductors to implement the system at 10 GBPS. The die area for this implementation would be enormous and costly.

However, because the demultiplexers are set up to operate such that demultiplexer latches 1202, 1204 alternate clocking data from D3 2330, on opposite edges of a 5 GHz clock, the flip-flop slave 2902 of the demultiplexer latches 1202, 1204 can be implemented with a design that is required to operate at only 5 GHz. Flip-flop master 2900 still receives 10 GBPS data in over data line D3 2330, and therefore must still be able to read data at that rate (even though it clocks in only every other bit on the positive edge of the 5 GHz clock 2320). Because flip-flop slave 2902 is receiving only every other bit of D3 2330 at 5 GHz, and because it is only being clocked at 5 GHz, it is able to function with a design that need only accommodate a 5 GBPS data rate and 5 GHz clock. Such a design may be implemented in the conventional 0.13µ CMOS process without need for an inductor. Thus, only half of the inductors would be needed (i.e. 16 rather than 32), which provides a tremendous saving in die area over a conventional demultiplexing flip-flop implementation.

Figure 12C:
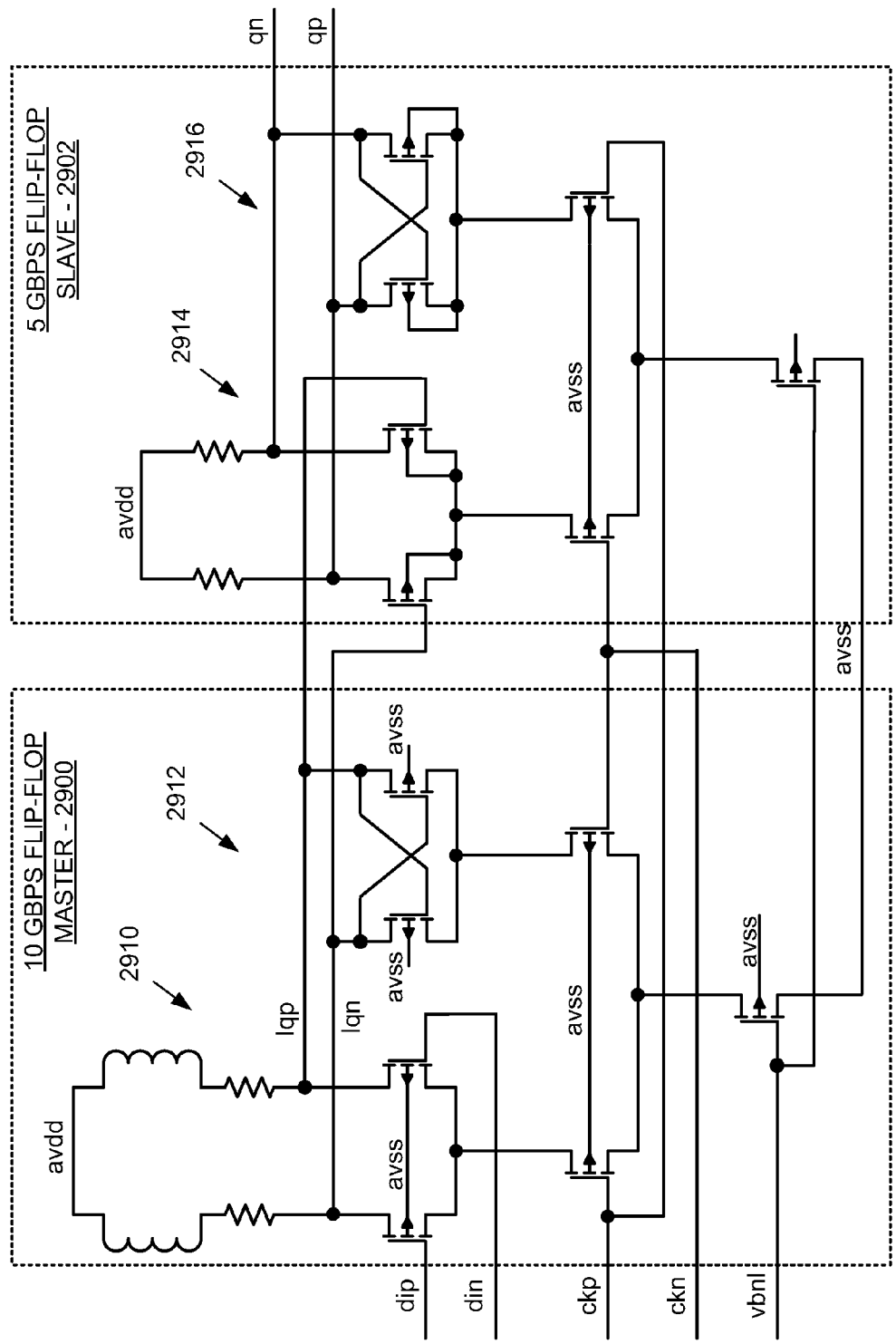
FIG. 12C is a circuit diagram illustrating the master/slave flip-flop arrangement of FIG. 12B, showing in detail the structure of the higher rate master flip-flop and the lower rate slave flip-flop.

FIG. 12C is a circuit diagram illustrating the master/slave flip-flop arrangement of FIG. 12B, showing in detail the structure of the higher rate master flip-flop 2900 and the lower rate slave flip-flop 2902. The circuit of FIG. 12C illustrated as a differential circuit. Demultiplexer latch 2900 includes a driver 2910 and a latch 2912. As is shown, the driver 2910 includes an inductor that allows the driver 2910 to switch at the higher data rate of 10 GBPS. As contrasted to the master demultiplexer latch 2900, a driver 2914 (coupled to latch 2916) of the demultiplexer latch slave 2902 does not include an inductor, which slows down its operation somewhat. However, the circuit supports switching at the 5 GHz rate, and because it is only being clocked at 5 GHz, it is able to function with a latch design that need only accommodate a 5 GBPS data rate and 5 GHz clock. Such a flip-flop may be implemented in the conventional 0.13µ CMOS process without need for an inductor.

Figure 13:
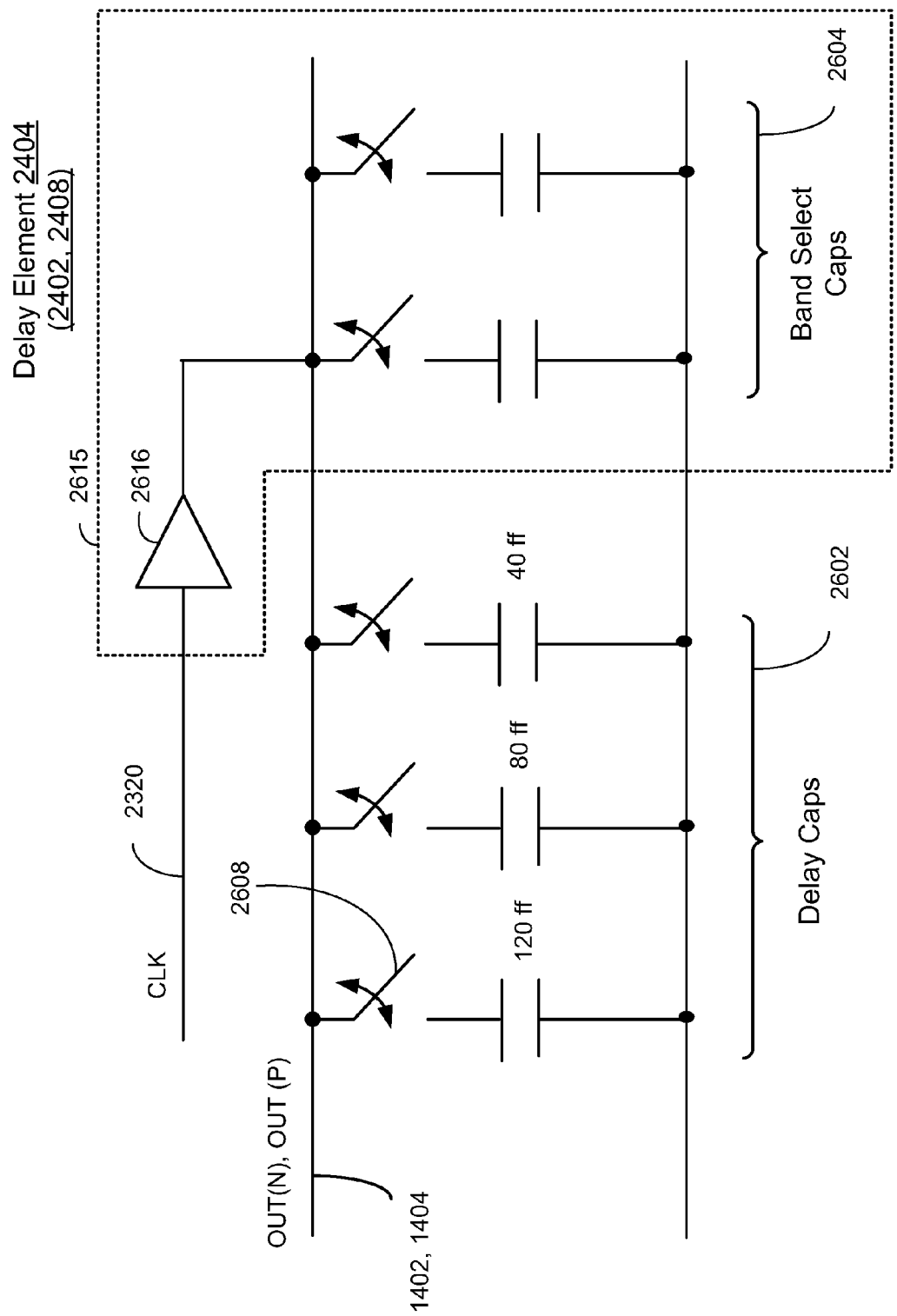
FIG. 13 is a circuit diagram illustrating a delay element constructed according to the present invention.

FIG. 13 is a circuit diagram illustrating a delay element (2402, 2404, and/or 2408 of FIGS. 11 and 12) constructed according to the present invention. The particular capacitance values illustrated in FIG. 13 are particular to the delay element 2408. Capacitors 2602 are introduced in increments to cause the delay element 2408 to introduce corresponding delays. The reader will appreciate that the total capacitive load introduced by the delay capacitors 2602 will increase or decrease a tuned driver 2615 output response time. The total capacitance coupled to the output of the tuned driver 2615 by the delay capacitors 2602 can thus be controlled with an n-bit digital setting (the length of the setting will depend upon the total number of capacitors that make up the network), the bits of which each control one of the switches 2608.

Thus, the delay capacitors 2602 may be coupled to the output of the driver 2615 of the delay element in combinations of 0, 40, 80, 120, 160, 200, and 240 femto farads (ff, $10^{-15}$ farads). To produce a delay range of ±10 picoseconds of the delay element 2408, the delay is normalized to the center position with a load of 120 ff. Thus, the clock edge can be retarded using additional capacitance, or it can be advance using less capacitance. The reader will appreciate that differing levels of delay may produced using different sized drivers and differing capacitor values.

Empirically, it can be determined what total delay range must be provided for a particular application by examining the jitter specifications that must be met between the transmitting and receiving circuits, and the nature of the delays that are created in generating the clock and data signals as well as transmitting them between chips or circuit blocks. For the example of the RX data demultiplexer circuit 306 coupled to the InP demultiplexer circuit 308, it was determined that about 40 ps of total delay was needed to adequately compensate for skewing between clock and data for the Q40 interface previously discussed. It was also determined that because the clock signal was rendered sinusoidal in nature by the parasitic effects of the boards traces, it could be delayed the most without further degrading the quality of the clock signal. The data, on the other hand, became increasingly degraded based on the amount of delay imposed. Thus, the bulk of the delay adjustment was allocated to the clock signal, and the clock was placed in the middle of the delay structure between the two sets of data lines in order to facilitate the adjustment of the skew.

Once the total range of delay that is required for an application has been determined, the optimal settings for the capacitance arrays of all of the delays may be determined through a circuit test that varies the settings until the optimal setting is determined. Because variations in the clock/data relationship will remain reasonably constant, once a digital word representing the settings for all of the delays has been determined for the setting, it can be programmed into all of the RX data demultiplexers 306 manufactured for a given board design and/or package. Programming of the delay capacitors 2602 can be accomplished by programming the word into a memory maintained in the circuit, or it could be programmed by the tester through fuse programmable links.

The amount of delay that is distributed among the delay elements of the delay structure of the invention will vary from one application to another. The specific example provided herein is therefore not intended to be a limitation, but only to be instructive in applying the invention to various applications. Moreover, although delays can be significantly greater for signal interfaces between chips, it is conceivable that such skews between internal circuit blocks could also benefit from application of the present invention.

As previously mentioned, in the example of the RX data demultiplexer circuit 306 coupled to the InP demultiplexer circuit 308, the data rate is permitted to range between 9.9 GHz and 11.1 GBPS. The clock can also vary between 5 and 6.6 GHz. This fact introduces an additional effect on the clock/data relationship. Therefore, in the delay element 2408 includes band-select capacitors 2604 that are coupled to the output of driver element 2616 are used to compensate for variations in the input clock and data rates.

Figure 14:
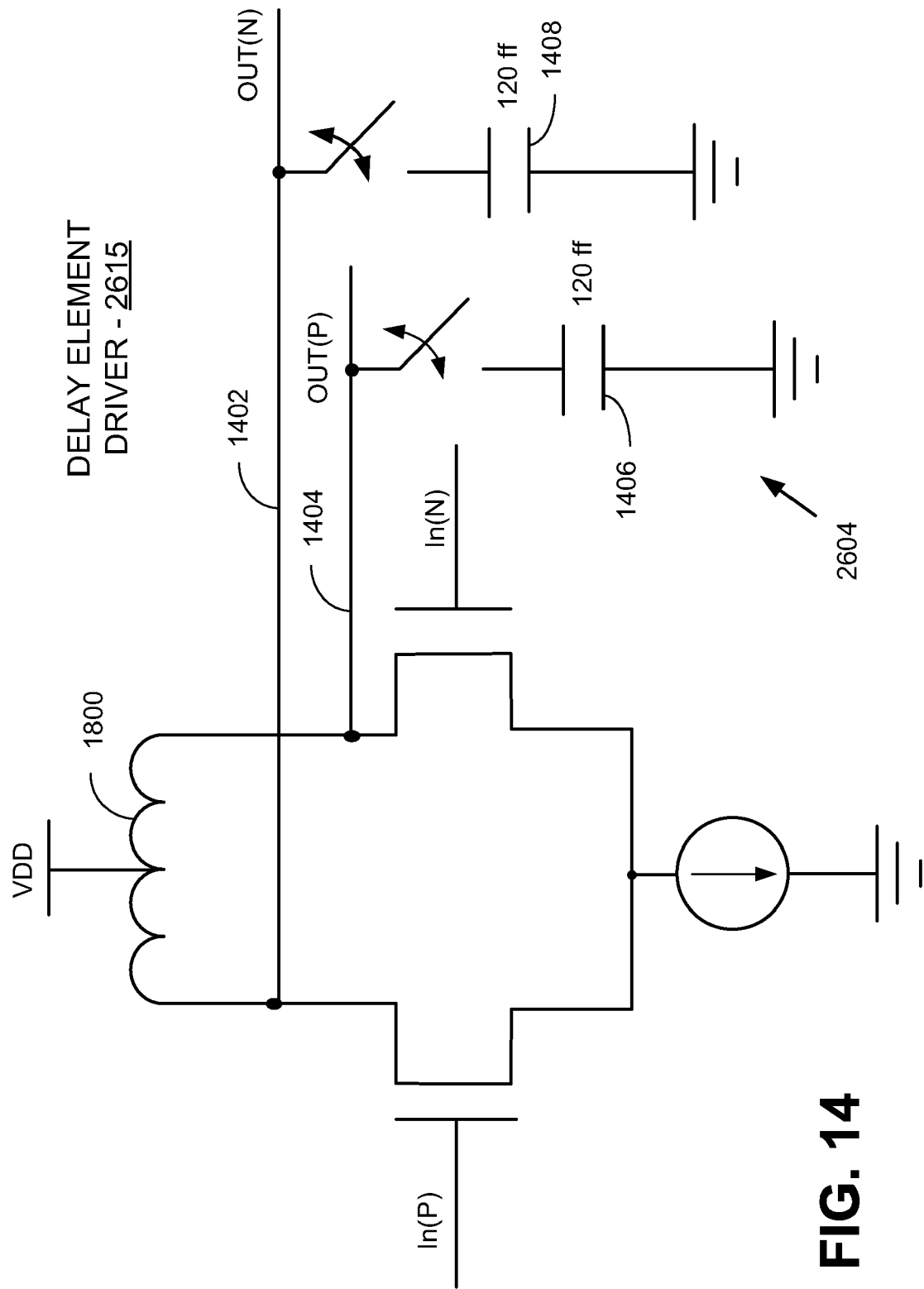
FIG. 14 is a block diagram illustrating a differential configuration of the delay element driver constructed according to the present invention.

FIG. 14 is a block diagram illustrating a differential configuration of the delay element driver 2615 constructed according to the present invention. Using a conventional buffer amplifier as the delay element driver 2615 of FIG. 13 (of the delay elements 2402, 2404) with center load impedance 1800 renders a particular response at the frequencies of the clock and data (i.e. 5 and 10 GHz respectively) that may be unsuitable for latching data into the demultiplexers (2406, 2420 FIG. 11) because a standard driver would not be able to drive the load of the demultiplexers 2406 and 2420 at those frequencies.

Thus, according to the present invention, each of the differential outputs OUT(N) 1402 and OUT(P) 1404 includes tuning capacitors 1406 and 1408 that are controlled based upon a selected frequency of operation. For simplicity, the delay element 2404 of FIG. 13 was shown single-ended and the reader will appreciate how the delay element driver 2415 is illustrated in a double-ended fashion in FIG. 14. The delay element driver 2615 of FIG. 14 can be tuned using the band select capacitors 1406 and 1408 to cancel the effects of the inductive center load impedance 1800.

Figure 15A:
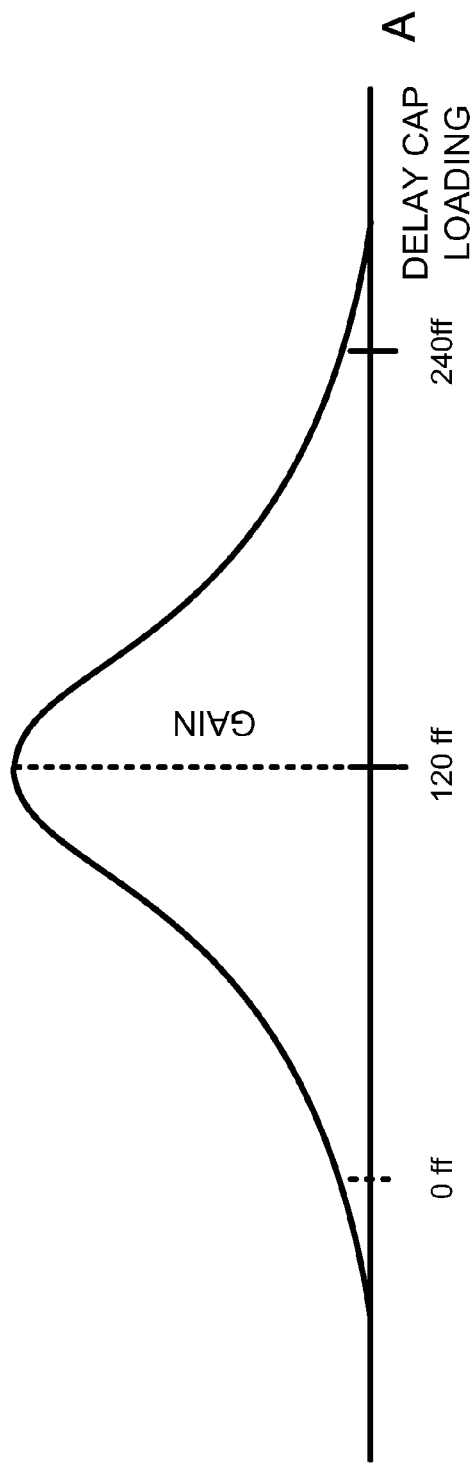
FIGS. 15A and 15B are response curves for the tuned delay element amplifier of FIG. 14 with high and optimized Q factors respectively.
Figure 15B:
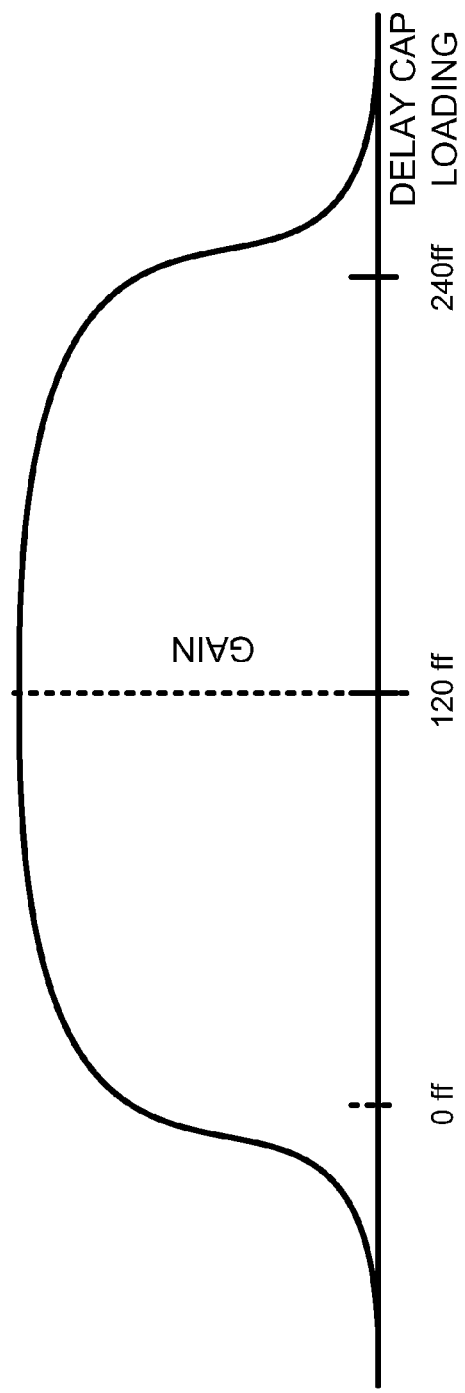

The quality factor (i.e. Q) of the tuned response of the delay element driver 2615 must be optimized. If the Q is too high, the response will look like that of FIG. 15A, where the gain of the buffer amplifier 2615 is sufficient at 120 ff delay capacitor 2602 loading, but is less than sufficient on either side of the center capacitance value of 120 ff. If the Q is lowered, the gain flattens out and remains sufficient over the entire range of the delay capacitor network 2602 as illustrated in FIG. 15B. The Q cannot be too low either, because the overall gain will begin to drop below a level that is adequate.

In one alternative embodiment, the signal delay structure for eliminating skew between a clock signal and a plurality of data signals includes a first level clock delay element having an input coupled to the clock and producing a first adjustment to the clock's phase. The structure includes a plurality of second level clock delay elements each having an input coupled to the output of the first level clock delay element, each of the two or more second clock delay elements producing a second clock timing adjustment to the clock signal. The structure further includes a plurality of data delay elements each having an input coupled to one of the plurality of data signals and producing a data timing adjustment.

Certain embodiments may include the first and second level clock delay elements, as well as the data delay elements each have a driver that has an input corresponding to the input of the delay elements and an output corresponding to the output of the delay element. The driver output is coupled to a switched capacitor array comprising a plurality of capacitors in parallel that are each coupled or decoupled to the output of the driver by a switch that is opened or closed based on the value of a bit of a digital array setting. The array provides a variable load capacitance to the driver output over some range of capacitance values dictated by the values of the capacitors of the array.

Also, certain embodiments may be implemented such that the driver of the signal delay further is a tuned amplifier having an inductor. The tuned amplifier is tuned to offset the effects of the load capacitance of the array on the amplifier's response at the clock or data frequency. The quality factor of the amplifier's response is optimized to ensure that the effects of the load capacitance are offset over the range of load capacitance values of the array. The clock has a nominal frequency but has a permissible range. Therefore a portion of the array coupled to the output of the first level clock delay is devoted to offsetting clock frequencies that exceed the nominal frequency.

Various embodiments may be implemented such that the variable load capacitance of the arrays of the delay elements provides for a range of capacitance values that corresponds to a range of first and second clock timing adjustments and a data timing adjustment. The timing adjustments advance the clock and data signals for array values that exceed a midpoint of the range of capacitance values, and retard the signals for values that are below the midpoint of the range of the capacitance values.

In another embodiment, a method is implemented for minimizing skew between a clock and each of a plurality of data signals, where the clock and each of the data signals are coupled to a plurality of latching devices for latching the value of the data coincidental with an edge of the clock, includes making a first level clock adjustment to eliminate a portion of the skew that is common to the clock and all of the data signals, making a second level clock adjustment to eliminate a portion of the skew that is common to the clock and a subset of the plurality of data signals, and making a data adjustment to eliminate a portion of the skew that is specific to the clock and each of the plurality of data signals.

In yet another embodiment of the invention, a second level clock adjustment is made to compensate for a component of the skew that is a function of the frequency of the clock. Each data adjustment is made by programming a capacitive load value for a first level clock delay element, a second level clock delay element and a data delay element. The capacitive load value is programmed to advance the signal with a capacitive load value that is greater than the middle value of a range of the capacitive values, and retarding the signal with a capacitive load value that is less than the middle value of the range of the capacitive values. The first level clock adjustment is combined with the second level clock adjustment through a symmetric coupling between a first level clock delay element and two or more second level clock delay elements.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. An apparatus, comprising:
a plurality of data inputs that is operative to receive a first plurality of data signals, such that each of the first plurality of data signals has a first frequency;
a clock input that is operative to receive a clock signal;
a common clock delay element that is operative to modify the clock signal thereby generating a modified clock signal;
a plurality of clock delay elements that is operative to process the modified clock signal thereby generating a modified plurality of clock signals such that each of the modified plurality of clock signals corresponds to one of the first plurality of data signals;
a plurality of data delay elements that is operative to modify each of the plurality of data signals, respectively, thereby generating a second plurality of data signals;
a plurality of demultiplexer groups that is operative to demultiplex the second plurality of data signals, based on the modified plurality of clock signals, thereby generating a third plurality of data signals, such that each of the third plurality of data signals has a second frequency; and
a plurality of data outputs that is operative to output the third plurality of data signals.

2. The apparatus of claim 1, wherein:
each of the common clock delay element, the plurality of clock delay elements, and the plurality of data delay elements includes at least one respective setting that is configured based on a programming word that is provided to each of the common clock delay element, the plurality of clock delay elements, and the plurality of data delay elements.

3. The apparatus of claim 1, wherein:
the second frequency is less than the first frequency.

4. The apparatus of claim 1, wherein:
the third plurality of data signals includes a first subset of data signals and a second subset of data signals;
a first signal of the second plurality of data signals is demultiplexed to generate the first subset of data signals; and
a second signal of the second plurality of data signals is demultiplexed to generate the second subset of data signals.

5. The apparatus of claim 1, wherein:
the plurality of demultiplexer groups includes a first subset of demultiplexer groups and a second subset of demultiplexer groups;
a first clock signal of the modified plurality of clock signals is provided to each demultiplexer group within the first subset of demultiplexer groups; and
a second clock signal of the modified plurality of clock signals is provided to each demultiplexer group within the second subset of demultiplexer groups.

6. The apparatus of claim 1, wherein:
the apparatus is coupled to at least one additional apparatus;
the apparatus is operative to support a first maximum switching frequency;
the at least one additional apparatus is operative to support a second maximum switching frequency; and
the first maximum switching frequency is less than the second maximum switching frequency.

7. The apparatus of claim 1, wherein:
the apparatus is coupled to at least one additional apparatus;
the apparatus is a CMOS integrated circuit manufactured using a Silicon process; and
the at least one additional apparatus is a CMOS integrated circuit manufactured using Indium-Phosphate process or a Silicon-Germanium process.

8. The apparatus of claim 1, wherein:
the common clock delay element is symmetrically located between the plurality of clock delay elements.

9. The apparatus of claim 1, wherein:
the common clock delay element is operative to compensate for skew between the clock signal and all of the first plurality of data signals; and
the plurality of data delay elements is operative to compensate individually for skew between the clock signal and each respective data signal of the first plurality of data signals.

10. The apparatus of claim 1, wherein:
the first plurality of data signals includes a first data signal and a second data signal;
the first data signal is provided to the apparatus via a first trace having a first length; and
the second data signal is provided to the apparatus via a second trace having a second length.

11. An apparatus, comprising:
a plurality of data inputs that is operative to receive a first plurality of data signals, such that each of the first plurality of data signals has a first frequency;
a clock input that is operative to receive a clock signal;
a common clock delay element that is operative to modify the clock signal based on a programming word thereby generating a modified clock signal;
a plurality of clock delay elements that is operative to process the modified clock signal based on the programming word thereby generating a modified plurality of clock signals such that each of the modified plurality of clock signals corresponds to one of the first plurality of data signals;
a plurality of data delay elements that is operative to modify each of the plurality of data signals, respectively, based on the programming word thereby generating a second plurality of data signals;
a plurality of demultiplexer groups that is operative to demultiplex the second plurality of data signals, based on the modified plurality of clock signals, thereby generating a third plurality of data signals, such that each of the third plurality of data signals has a second frequency, wherein the second frequency is less than the first frequency; and
a plurality of data outputs that is operative to output the third plurality of data signals; and wherein:
the common clock delay element is operative to compensate for skew between the clock signal and all of the first plurality of data signals; and
the plurality of data delay elements is operative to compensate individually for skew between the clock signal and each respective data signal of the first plurality of data signals.

12. The apparatus of claim 11, wherein:
the third plurality of data signals includes a first subset of data signals and a second subset of data signals;
a first signal of the second plurality of data signals is demultiplexed to generate the first subset of data signals; and
a second signal of the second plurality of data signals is demultiplexed to generate the second subset of data signals.

13. The apparatus of claim 11, wherein:
the plurality of demultiplexer groups includes a first subset of demultiplexer groups and a second subset of demultiplexer groups;
a first clock signal of the modified plurality of clock signals is provided to each demultiplexer group within the first subset of demultiplexer groups; and
a second clock signal of the modified plurality of clock signals is provided to each demultiplexer group within the second subset of demultiplexer groups.

14. The apparatus of claim 11, wherein:
the apparatus is coupled to at least one additional apparatus;
the apparatus is operative to support a first maximum switching frequency;
the at least one additional apparatus is operative to support a second maximum switching frequency; and
the first maximum switching frequency is less than the second maximum switching frequency.

15. The apparatus of claim 11, wherein:
the apparatus is coupled to at least one additional apparatus;
the apparatus is a CMOS integrated circuit manufactured using a Silicon process; and
the at least one additional apparatus is a CMOS integrated circuit manufactured using Indium-Phosphate process or a Silicon-Germanium process.

16. The apparatus of claim 11, wherein:
the first plurality of data signals includes a first data signal and a second data signal;
the first data signal is provided to the apparatus via a first trace having a first length; and
the second data signal is provided to the apparatus via a second trace having a second length.

17. A method, comprising:
receiving a first plurality of data signals, such that each of the first plurality of data signals has a first frequency;
employing a common clock delay element to modify a clock signal thereby generating a modified clock signal;
employing a plurality of clock delay elements to process the modified clock signal thereby generating a modified plurality of clock signals such that each of the modified plurality of clock signals corresponds to one of the first plurality of data signals;
employing a plurality of data delay elements to modify each of the plurality of data signals, respectively, thereby generating a second plurality of data signals;
demultiplexing the second plurality of data signals, based on the modified plurality of clock signals, thereby generating a third plurality of data signals, such that each of the third plurality of data signals has a second frequency; and
outputting the third plurality of data signals.

18. The method of claim 17, further comprising:
providing a programming word to each of the common clock delay element, the plurality of clock delay elements, and the plurality of data delay elements; and
configuring at least one respective setting in each of the common clock delay element, the plurality of clock delay elements, and the plurality of data delay elements based on the programming word.

19. The method of claim 17, further comprising:
employing the common clock delay element to compensate for skew between the clock signal and all of the first plurality of data signals; and
employing the plurality of data delay elements to compensate individually for skew between the clock signal and each respective data signal of the first plurality of data signals.

20. The method of claim 17, wherein:
the third plurality of data signals includes a first subset of data signals and a second subset of data signals; and further comprising:
demultiplexing a first signal of the second plurality of data signals to generate the first subset of data signals; and
demultiplexing a second signal of the second plurality of data signals to generate the second subset of data signals.

* * * * *